US009836698B2

United States Patent
Bocharov et al.

(10) Patent No.: US 9,836,698 B2
(45) Date of Patent: Dec. 5, 2017

(54) METHOD AND SYSTEM FOR DECOMPOSING SINGLE-QUBIT QUANTUM CIRCUITS INTO A DISCRETE BASIS

(75) Inventors: Alexei Bocharov, Redmond, WA (US); Krysta Svore, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 13/552,639

(22) Filed: Jul. 19, 2012

(65) Prior Publication Data

US 2014/0026108 A1   Jan. 23, 2014

(51) Int. Cl.
*G06F 17/50* (2006.01)
*G06N 99/00* (2010.01)
*B82Y 10/00* (2011.01)

(52) U.S. Cl.
CPC ............ *G06N 99/002* (2013.01); *B82Y 10/00* (2013.01); *G06F 17/505* (2013.01); *G06F 17/5045* (2013.01); *G06F 17/5072* (2013.01)

(58) Field of Classification Search
CPC ... G06N 99/002; B82Y 10/00; G06F 17/5045; G06F 17/505; G06F 17/5072
See application file for complete search history.

(56) References Cited

U.S. PATENT DOCUMENTS

| | | | |
|---|---|---|---|
| 7,018,852 B2* | 3/2006 | Wu et al. .......................... 438/2 |
| 8,209,279 B2* | 6/2012 | Freedman et al. .............. 706/62 |
| 8,671,369 B2* | 3/2014 | Ahn ............................. 716/100 |
| 9,208,280 B2* | 12/2015 | Bocharov ........... G06F 17/5045 |
| 2003/0055513 A1* | 3/2003 | Raussendorf ........ G06N 99/002 700/1 |
| 2003/0224547 A1* | 12/2003 | Lee et al. ......................... 438/22 |
| 2006/0123363 A1* | 6/2006 | Williams et al. ................. 716/1 |
| 2008/0116448 A1* | 5/2008 | Kitaev ................. G06N 99/002 257/30 |
| 2010/0182039 A1* | 7/2010 | Baumgardner et al. .......... 326/7 |
| 2010/0251049 A1* | 9/2010 | Goto ...................... B82Y 10/00 714/746 |
| 2013/0144925 A1* | 6/2013 | Macready et al. ............ 708/620 |
| 2014/0264288 A1* | 9/2014 | Svore .................... B82Y 10/00 257/31 |
| 2014/0280404 A1* | 9/2014 | Svore ................... G06N 99/002 708/200 |

(Continued)

OTHER PUBLICATIONS

Ken Matsumoto et al., Representation of Quantum Circuits with Clifford and $Pi/8$ Gates, Quantum Physics, 17 pages, Jun. 2008.*

(Continued)

*Primary Examiner* — Helen Rossoshek
(74) *Attorney, Agent, or Firm* — Klarquist Sparkman, LLP

(57) ABSTRACT

Methods and systems transform a given single-qubit quantum circuit expressed in a first quantum-gate basis into a quantum-circuit expressed in a second, discrete, quantum-gate basis. The discrete quantum-gate basis comprises standard, implementable quantum gates. The given single-qubit quantum circuit is expressed as a normal representation. The normal representation is generally compressed, in length, with respect to equivalent non-normalized representations. The method and systems additionally can map normal representations to canonical-form representations, which are generally further compressed, in length, with respect to normal representations.

20 Claims, 19 Drawing Sheets

(56) References Cited

U.S. PATENT DOCUMENTS

2014/0280427 A1* 9/2014 Bocharov .............. B82Y 10/00
708/523
2017/0032272 A1* 2/2017 Bocharov ............ G06N 99/002

OTHER PUBLICATIONS

Matthew Amy et al., A Meet-In-The-Middle Algorithm for Fast Synthesis of Depth-Optimal Quantum Circuits, Cornell University Library Print Service, arXiv:1206.0758v1 [quant-ph], Jun. 6, 2012. pp. 1-20.*
Buhrman et al.; 'New Limits on Fault-Tolerant Quantum Computation'; Year: 2006; 2006 47th Annual IEEE Symposium on Foundations of Computer Science (FOCS'06); pp. 411-419.*
Clark et al., "Generalized Clifford groups and simulation of associated quantum circuits," Quantum Information and Computation Rinton Press Inc. USA, 8:106-126 (Jan. 2008).
Hung et al., "Optimal Synthesis of Multiple Output Boolean Functions Using a Set of Quantum Gates by Symbolic Reachability Analysis," IEEE Transactions on Computer-Aided Design of Integrated Circuits and Systems, 25:1652-1663 (Sep. 2006).
International Search Report and Written Opinion from International Application No. PCT/US2013/051176, dated Nov. 22, 2013, 12 pages.
International Preliminary Report on Patentability from International Application No. PCT/US2013/051176, dated Jan. 20, 2015, 8 pages.

* cited by examiner

| | |
|---|---|
| $G_0$ | Id |
| $G_1$ | H |
| $G_2$ | HSSH |
| $G_3$ | SS |
| $G_4$ | S |
| $G_5$ | SSS |
| $G_6$ | HSS |
| $G_7$ | SSH |
| $G_8$ | SH |
| $G_9$ | SSSH |
| $G_{10}$ | SSHSSH |
| $G_{11}$ | SHSSH |
| $G_{12}$ | SSSHSSH |
| $G_{13}$ | HS |
| $G_{14}$ | HSSS |
| $G_{15}$ | SSHSS |
| $G_{16}$ | SHSS |
| $G_{17}$ | SSSHSS |
| $G_{18}$ | HSH |
| $G_{19}$ | HSSSH |
| $G_{20}$ | HSHSSH |
| $G_{21}$ | HSSSHSSH |
| $G_{22}$ | SSSHS |
| $G_{23}$ | SHSSS |

| | |
|---|---|
| $G_0T$ | T |
| $G_1T$ | HT |
| $G_2T$ | $TG_{12}$ |
| $G_3T$ | $TG_3$ |
| $G_4T$ | $TG_4$ |
| $G_5T$ | $TG_5$ |
| $G_6T$ | $HTG_3$ |
| $G_7T$ | $HTG_{12}$ |
| $G_8T$ | $HSHTG_2$ |
| $G_9T$ | $HSHTG_4$ |
| $G_{10}T$ | $TG_{11}$ |
| $G_{11}T$ | $TG_2$ |
| $G_{12}T$ | $TG_{10}$ |
| $G_{13}T$ | $HTG_4$ |
| $G_{14}T$ | $HTG_5$ |
| $G_{15}T$ | $HTG_{11}$ |
| $G_{16}T$ | $HSHTG_{10}$ |
| $G_{17}T$ | $HSHTG_5$ |
| $G_{18}T$ | HSHT |
| $G_{19}T$ | $HSHTG_{12}$ |
| $G_{20}T$ | $HTG_2$ |
| $G_{21}T$ | $HTG_{10}$ |
| $G_{22}T$ | $HSHTG_3$ |
| $G_{23}T$ | $HSHTG_{11}$ |

FIG. 5C

METHOD AND SYSTEM FOR DECOMPOSING SINGLE-QUBIT QUANTUM CIRCUITS INTO A DISCRETE BASIS

TECHNICAL FIELD

The current application is directed to quantum computing and, in particular, to a method and system for expressing a given single-qubit quantum circuit as a composition of standard single-qubit quantum gates that together comprise a discrete quantum-gate basis for quantum circuits and for storing the composition in a data-storage device.

BACKGROUND

Enormous advances have been made in digital computing over the past 70 years. Crude, high-energy-consuming, vacuum-tube-based computer systems developed in the 1940s have evolved into today's personal computers, work stations, servers, and high-end distributed computer systems, based on multi-core single-integrated-circuit processors, that economically provide processing speeds, data-storage capacities, and data-transfer bandwidths that were unimaginable even 20 years ago. However, digital computing appears to be bounded by certain physical and problem-domain constraints.

With regard to physical constraints, processing speeds and data-storage capacities are generally inversely related to the minimum sizes at which transistors and other circuit elements can be fabricated within integrated circuits. Much of the exponential growth observed in computational bandwidth for various classes of computer systems can be attributed to a corresponding decrease in feature sizes within integrated circuits. There are, however, fundamental physical limits, on the order of the sizes of complex molecules, past which feature sizes cannot be further decreased, and somewhat larger feature-size limitations past which further decreases in feature sizes can be obtained only by exponentially increasing integrated-circuit cost.

With regard to problem-domain constraints, while digital computers provide the basis for practical and cost-effective solutions of many types of computational problems, there are many types and classes of computational problems that appear incapable of being addressed efficiently by digital computer systems. Examples include accurate simulation of the quantum-mechanical behavior of large molecules and aggregations of molecules and a variety of traditional numerical and computational problems, including large-integer factoring and graph-isomorphism problems.

In 1982, Richard Feynman made a suggestion for a new type of computational system based on quantum-mechanical components. He suggested that quantum computers could more efficiently address certain classes of computational problems than digital computers and, in the case of computational problems in computational chemistry and physics, provide practical approaches to computational problems that are intractable using digital computer systems. Since that time, great progress has been made in developing the theoretical foundation for quantum computing and the first quantum computers have been implemented. Various computational problems have been identified that can be addressed more efficiently by quantum computers than by classical digital computers. However, significant research and development efforts continue to be applied in order to provide practical and cost-effective general-purpose quantum-computing systems for widespread use. As one example, significant theoretical efforts are currently being applied to identify cost-effective implementations of quantum circuits.

SUMMARY

The current application is directed to methods and systems which transform a given single-qubit quantum circuit expressed in a first quantum-gate basis into a quantum-circuit expressed in a second, discrete, quantum-gate basis. The discrete quantum-gate basis comprises standard implementable quantum gates. The given single-qubit quantum circuit is expressed as a normal representation. The normal representation is generally compressed, in length, with respect to equivalent non-normalized representations. The method and systems additionally provide a mapping from normal representations to canonical-form representations, which are generally further compressed, in length, with respect to normal representations. The normal and canonical-form representations can be used to implement methods and systems for search-based quantum-circuit design. Neither this section nor the sections which follow are intended to either limit the scope of the claims which follow or define the scope of those claims.

BRIEF DESCRIPTION OF THE DRAWINGS

FIGS. 5A-C illustrate the group CPH.

DETAILED DESCRIPTION OF EMBODIMENTS

It should be noted, at the onset, that although the current application employs mathematical notation and control-flow diagrams, the current application is directed to a method and system for producing physical, tangible, digital representations of quantum circuits that are stored in physical data-storage devices and systems, including optical disks within optical-disk drives, magnetic disks within magnetic-disk drives, electronic memories within computer systems, and other such physical, tangible data-storage devices. Furthermore, the quantum-circuit representations produced by methods and systems disclosed in the current application provide for the design of quantum circuits, the cost-effectiveness of which can be directly physically measured by the amount of data-storage-device capacity needed to store the quantum-circuit representations, by the cost in time and energy consumption in computing the representations for the quantum circuits, by the cost of implementing the quantum circuits programmatically or in hardware design, and by the time and energy consumed by the implemented quantum circuits. In other words, the current application is directed to real-world methods and systems of real-world utility that produce physical and physically measurable results. The following discussion includes three different subsections: (1) Overview of Digital Computer Systems; (2) Overview of Quantum Computing; and (3) Methods and Systems Disclosed in the Current Application. Those familiar with classical and quantum computing may wish to proceed to the final subsection.

Overview of Digital Computer Systems

Figure 1:
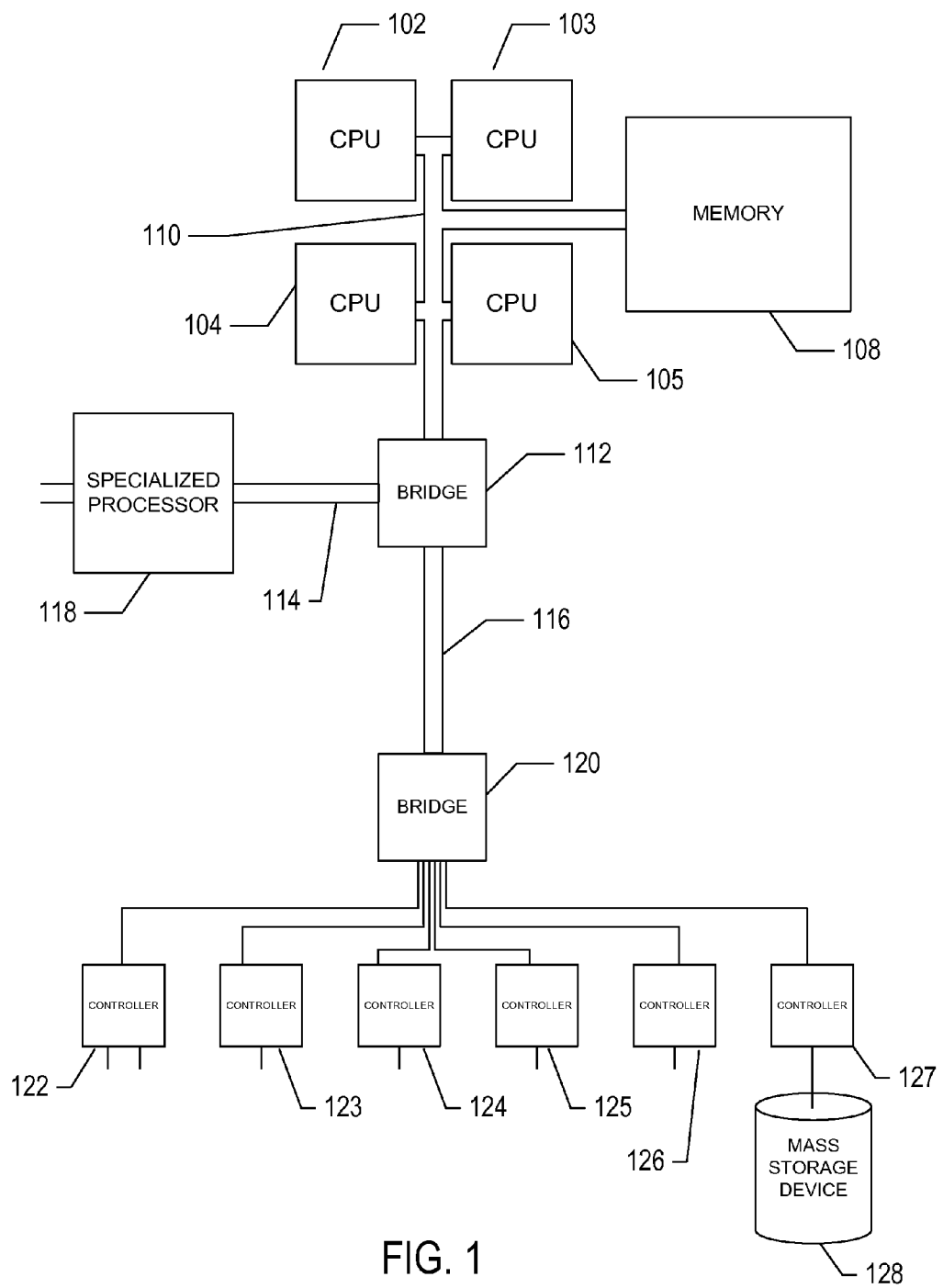
FIG. 1 provides an architectural diagram for a generalized digital computer that, when executing a control program that controls the computer system to generate normal representations of quantum circuits, represents a system to which the current application is directed.

FIG. 1 provides an architectural diagram for a generalized digital computer that, when executing a control program that controls the computer system to generate normal representations of quantum circuits, represents a system to which the current application is directed. The computer system contains one or multiple central processing units ("CPUs") 102-105, one or more electronic memories 108 interconnected with the CPUs by a CPU/memory-subsystem bus 110 or multiple busses, a first bridge 112 that interconnects the CPU/memory-subsystem bus 110 with additional busses 114 and 116 or other types of high-speed interconnection media, including multiple, high-speed serial interconnects. These busses or serial interconnections, in turn, connect the CPUs and memory with specialized processors, such as a graphics processor 118, and with one or more additional bridges 120, which are interconnected with high-speed serial links or with multiple controllers 122-127, such as controller 127, that provide access to various different types of mass-storage devices 128, electronic displays, input devices, and other such components, subcomponents, and computational resources. Digital computer systems store and manipulate information represented as binary numbers, or digits, of various lengths.

Figure 7:
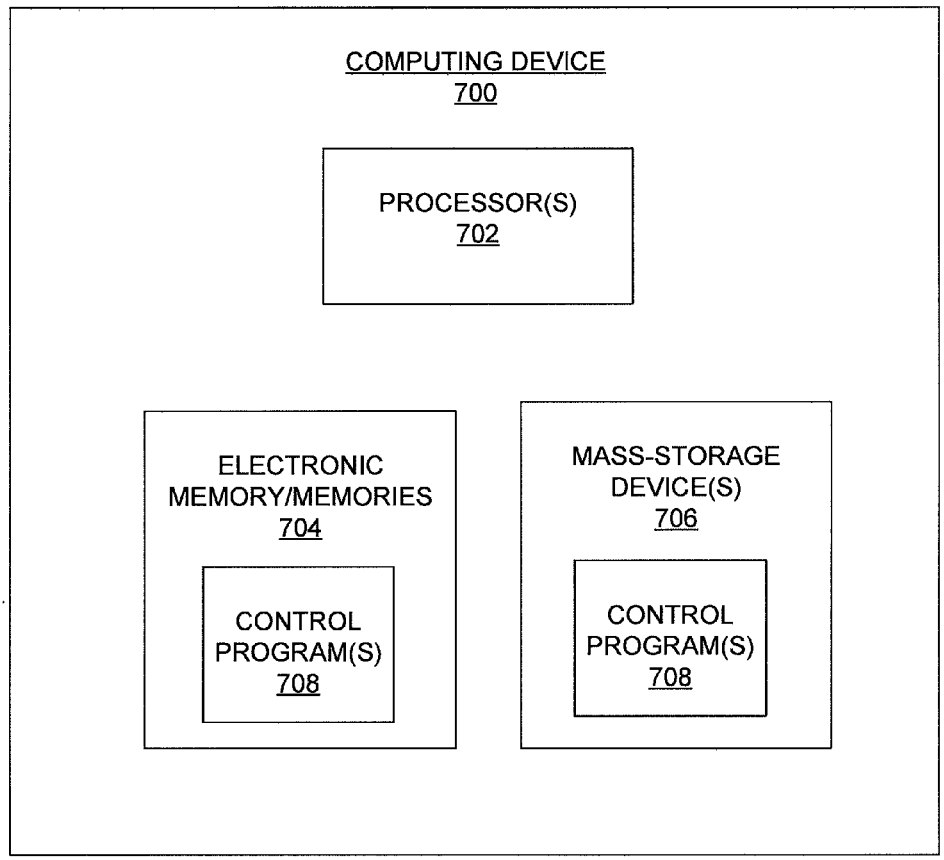
FIG. 7 illustrates a system for quantum-circuit design.
Figure 8:
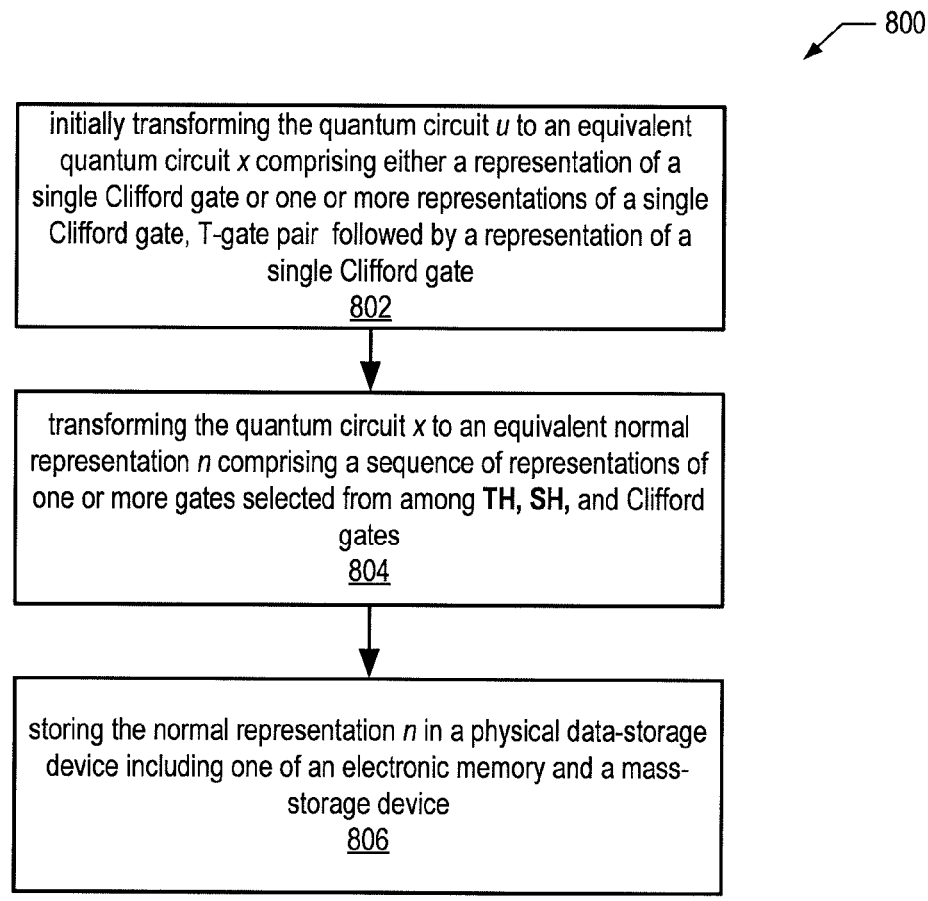
FIG. 8 illustrates a process for normalizing a representation of a quantum circuit u comprising a sequence of representations of H and T gates.
Figure 9:
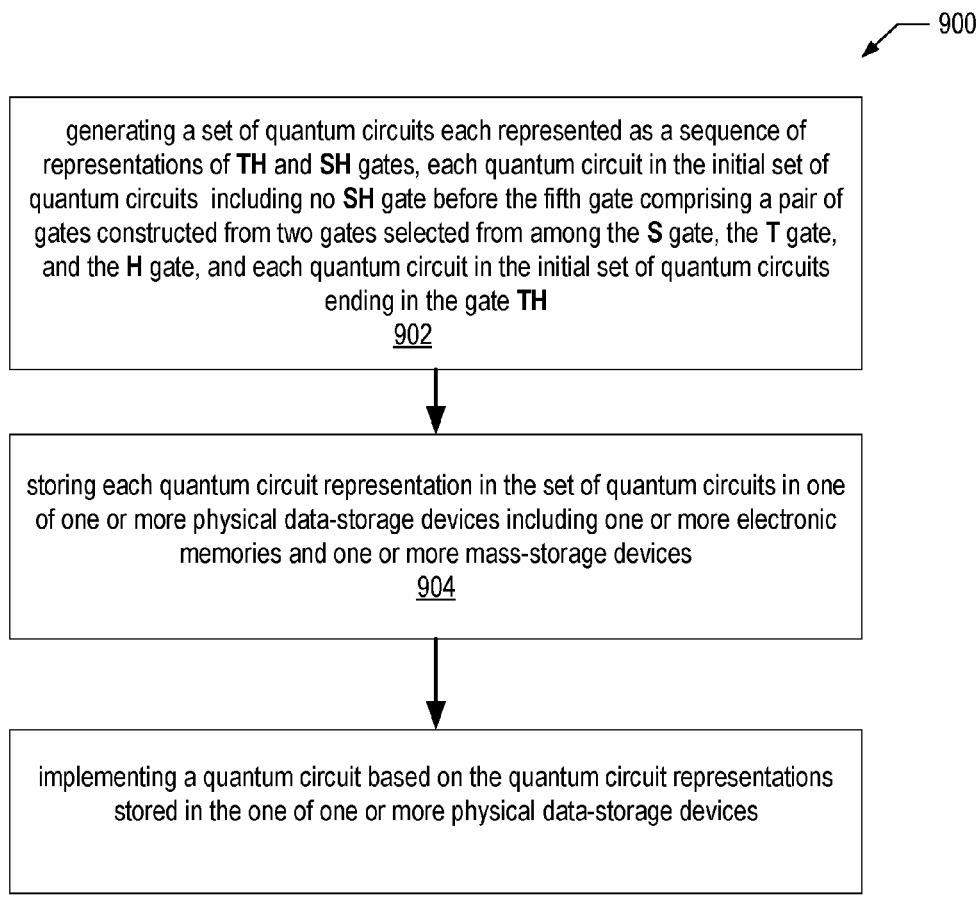
FIG. 9 illustrates a process for constructing a representation of possible quantum circuits represented as a sequence of representations of T and H gates.

FIG. 7 illustrates a computing device 700 for quantum-circuit design. The computing device 700 is comprised of one or more processors 702; one or more electronic memories 704; one or more mass-storage devices 706; and one or more control programs 708. The one or more control programs 708 may include a first control program and a second control program. The first control program may be executed on one or more of the one or more processors 702 to generate normal representations of quantum circuits, each normal representation comprising a sequence of representations of one or more gates selected from among TH, SH, and Clifford gates. The second control program may be executed on one or more of the one or more processors 702 to construct a representation of possible quantum circuits represented as a sequence of representations of T and H gates.

Overview of Quantum Computing

FIGS. 2A-D illustrate a quantum bit, referred to as a "qubit," which is a fundamental data-storage unit of many quantum-computing systems. The qubit is a quantum-computing analog of a classical digital-computer-system bit. A classical bit is considered to occupy, at any given point in time, one of two possible states corresponding to the binary digits "0" and "1." Of course, the classical bit is a high-level abstraction of a hardware implementation of the classical bit and, at the molecular level, the transistors and other circuit components and wiring that together compose a classical bit have an infinite number of quantum-mechanical states. Nonetheless, the complex quantum-mechanical states of a hardware implementation of a classical bit fall into two discrete and measurable subspaces that, in the aggregate, correspond to discrete and differentiable macroscopic states corresponding to binary digits "0" and "1."

By contrast, a qubit is implemented in hardware by tiny, physical components with quantum-mechanical characteristics that are generally contained within macroscopic subsystems. These tiny physical components can have an infinite number of different quantum-mechanical states. When the state of a qubit is physically measured, the measurement produces one of two different basis states $|0\rangle$ and $|1\rangle$. The quantum-mechanical state of a qubit is represented as a state vector representing a superposition of the two states $|0\rangle$ and $|1\rangle$:

$$|\psi\rangle = \alpha|0\rangle + \beta|1\rangle$$

where $\alpha$ and $\beta$ are complex numbers and $|\alpha|^2 + |\beta|^2 = 1$. The qubit state vector can be represented in vector notation as:

$$|\psi\rangle = \begin{bmatrix} \alpha \\ \beta \end{bmatrix}.$$

The choice of vector representations of the states $|0\rangle$ and $|1\rangle$ is somewhat arbitrary, but to facilitate mathematical operations, these two vectors are generally chosen to be orthonormal and are often assigned the vector representations:

$$|0\rangle = \begin{bmatrix} 1 \\ 0 \end{bmatrix}$$

$$|1\rangle = \begin{bmatrix} 0 \\ 1 \end{bmatrix}.$$

The notation $|\rangle$ is, in the Dirac notation, referred to as the "ket" notation for vectors of an inner-product vector space. This inner-product vector space has a dual inner-product vector space, the vectors of which are represented by the Dirac bra notation $\langle|$. The corresponding dual-inner-product vector space vectors for the above-discussed qubit state vectors are:

$$\langle\psi| = [\alpha^*, \beta^*]$$

$$\langle 0| = [1, 0]$$

$$\langle 1| = [0, 1]$$

where $\alpha^*$ is the complex conjugate of $\alpha$. The magnitude of a qubit state vector is computed as the square root of the inner product of the state vector and its corresponding dual state vector:

$$\||\psi\rangle\| = \sqrt{\langle\psi|\psi\rangle}$$
$$= \sqrt{\alpha\alpha^* + \beta\beta^*}$$
$$= 1.$$

Thus, state vectors used to describe qubit states are normalized to have a magnitude of 1, which is indicated by the "normal" syllable of the term "orthonormal." The "ortho" syllable refers to the fact that the state vectors $|0\rangle$ and $|1\rangle$ are chosen to be orthogonal, to simplify various operations, including taking inner products. Note that, by one convention, kets are represented by columns vectors and bras by row vectors. A complex row vector multiplied by a complex column vector, as in the above expression for the square root of the inner product of the state vector $|\psi\rangle$, produces a real number, while a column vector multiplied by a row vector produces a generally complex-valued matrix.

The quantum-mechanical state $|\psi\rangle$ of a qubit is not directly observable by measurement. Instead, physical measurement operations are performed on a qubit to produce a measured state in a computational basis such as the basis $|0\rangle$ or $|1\rangle$. The measurement operations can be represented as 2×2 matrices $M_0$ and $M_1$:

$$M_0 = |0\rangle\langle 0| = \begin{bmatrix} 1 & 0 \\ 0 & 0 \end{bmatrix}$$

$$M_1 = |1\rangle\langle 1| = \begin{bmatrix} 0 & 0 \\ 0 & 1 \end{bmatrix}.$$

The probability that a measurement of a qubit in state $|\psi\rangle$ will return a state $|0\rangle$ or $|1\rangle$ is obtained by the inner product:

$$p_m = \langle \psi | M_m^\dagger M_m | \psi \rangle$$

where m is 0 or 1, corresponding to a measurement that produces $|0\rangle$ or $|1\rangle$, respectively. For example, the probability $p_0$ that a measurement of the state of a qubit in state $|\psi\rangle$ produces $|1\rangle$ is obtained as:

$$p_0 = \langle \psi | M_0^\dagger M_0 | \psi \rangle$$
$$= [\alpha^*, \beta^*] \begin{bmatrix} 1 & 0 \\ 0 & 0 \end{bmatrix} \begin{bmatrix} \alpha \\ \beta \end{bmatrix}$$
$$= \alpha \alpha^*$$
$$= |\alpha|^2.$$

By a similar computation:

$$p_1 = |\beta|^2.$$

Thus, the squares of the magnitudes of the coefficients $\alpha$ and $\beta$ in the expression $|\psi\rangle = \alpha|0\rangle + \beta|1\rangle$ correspond to the probabilities that a measurement of a qubit in state $|\psi\rangle$ will produce states $|0\rangle$ and $|1\rangle$, respectively.

Figure 2A:
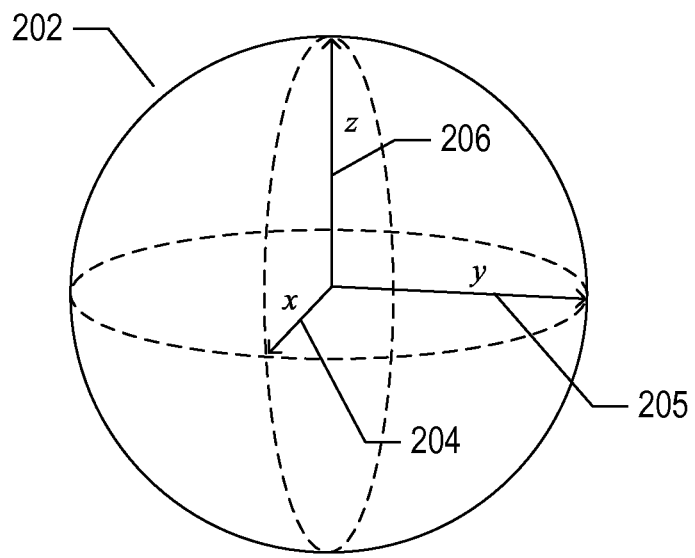
FIGS. 2A-D illustrate a quantum bit, referred to as a "qubit," which is a fundamental data-storage unit of many quantum-computing systems.
Figure 2B:
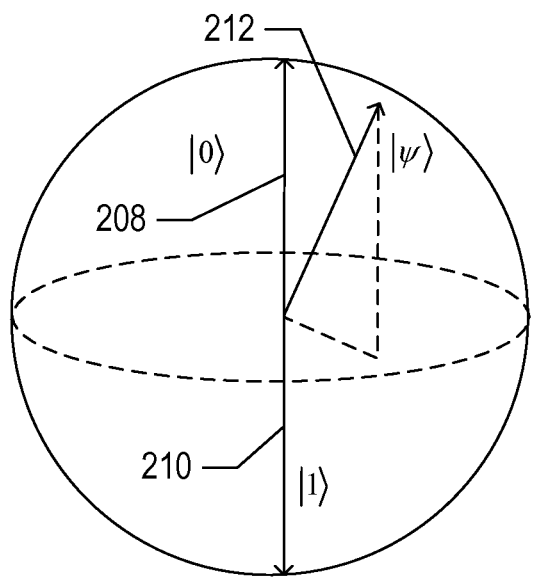

FIG. 2A shows a unit sphere 202 centered within a Cartesian coordinate system with orthonormal axes x 204, y 205, and z 206. The surface of this unit sphere represents all of the possible qubit state vectors $|\psi\rangle$ with unit modulus, analogous to the circle of an Argand diagram, discussed below, that represents all possible complex numbers of unit modulus. FIG. 2B shows an arbitrary qubit state vector $|\psi\rangle$ within the unit sphere shown in FIG. 2A. The vector of unit magnitude collinear with the positive z axis 208 is arbitrarily chosen to represent state vector $|0\rangle$ and the vector of unit magnitude collinear with the negative z axis 210 is chosen to represent state vector $|1\rangle$. Pairs of points at which a line passing through the origin intersects the unit sphere correspond to orthogonal state vectors. An arbitrary single-qubit state vector $|\psi\rangle$ 212 is a linear combination of the two computational-basis state vectors $|0\rangle$ and $|1\rangle$, as expressed by $|\psi\rangle = \alpha|0\rangle + \beta|1\rangle$, and can thus be any vector that can be inscribed within the unit sphere, with the particular vector corresponding to $|\psi\rangle$ depending on the values of $\alpha$ and $\beta$. The representation of the state of a qubit shown in FIG. 2B is referred to as a Bloch sphere.

Figure 2C:
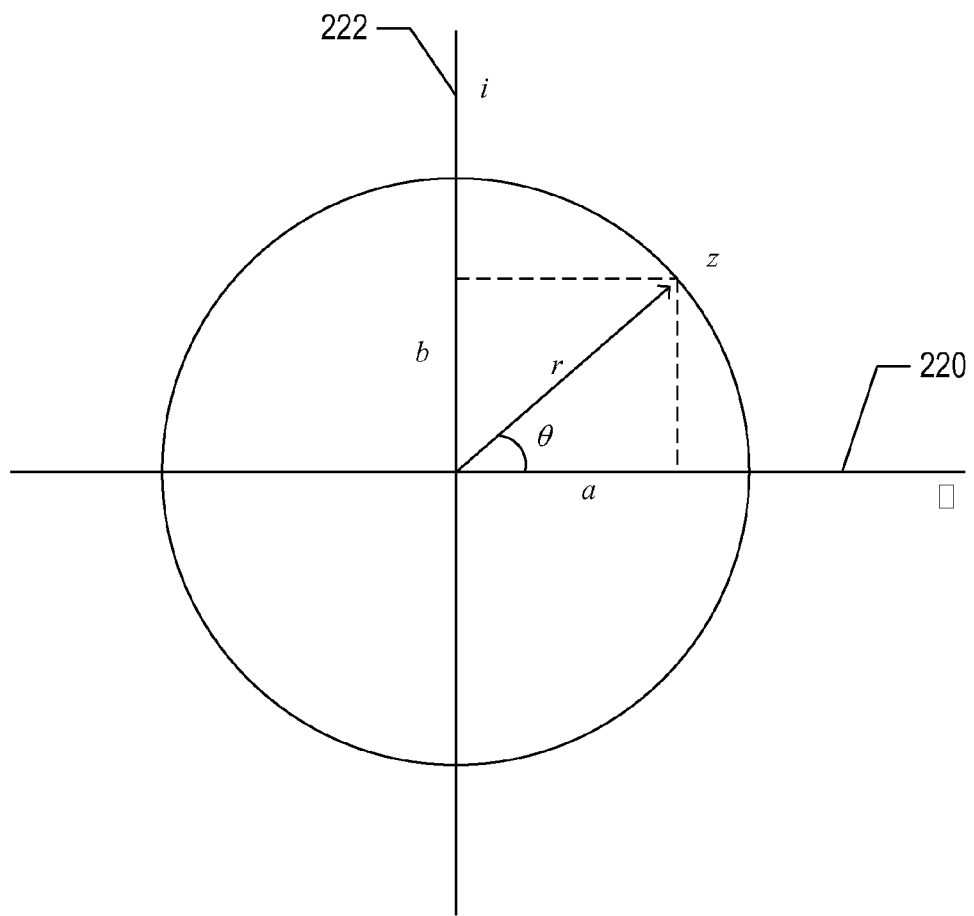

FIG. 2C shows the Argand diagram frequently used to illustrate various ways to represent a complex number. The horizontal axis 220 represents the real numbers and the vertical axis 222 represents the imaginary numbers. The general expression for a complex number z is:

$$z = a + ib$$

where a and b are real numbers and $i = \sqrt{-1}$. Because $$a = r \cos \theta$$

$$b = r \sin \theta,$$

as shown in FIG. 2C, the complex number z can be alternatively expressed in polar form as:

$$z = r(\cos\theta + i\sin\theta)$$
$$= re^{i\theta}$$
$$= e^{i\theta} \text{ for } |r| = 1.$$

Figure 2D:
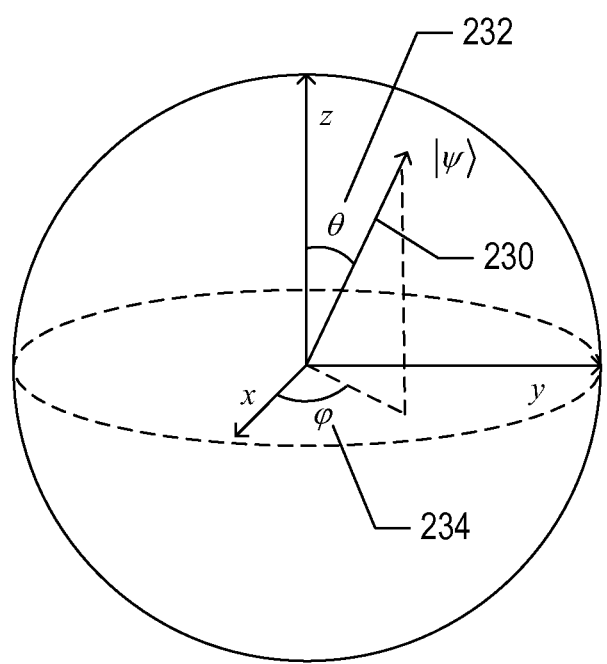

FIG. 2D shows a complete representation of the Bloch sphere for an arbitrary state vector $|\psi\rangle$. The state vector $|\psi\rangle$ 230 can be specified with two angles $\theta$ 232 and $\phi$ 234. Using the polar form for the complex coefficients $\alpha$ and $\beta$, state vector $|\psi\rangle$ can be expressed as:

$$|\psi\rangle = r_\alpha e^{i\Phi_\alpha}|0\rangle + r_\beta e^{i\Phi_\beta}|1\rangle$$

As previously discussed, the squares of the magnitudes of the coefficients $\alpha$ and $\beta$ correspond to the probabilities that a measurement of a qubit in state $|\psi\rangle$ will return state vectors $|0\rangle$ and $|1\rangle$, respectively. The state vector $|\psi\rangle$ can be multiplied by an arbitrary complex number with unit modulus, $e^{i\alpha}$, without changing the magnitudes of the squares of the coefficients $\alpha$ and $\beta$, as shown by:

$$e^{i\gamma}|\psi\rangle = e^{i\gamma}r_\alpha e^{i\Phi_\alpha}|0\rangle + e^{i\gamma}r_\beta e^{i\Phi_\beta}|1\rangle,$$

$$|e^{i\gamma}r_\alpha e^{i\Phi_\alpha}|^2 = e^{i\gamma}r_\alpha e^{i\Phi_\alpha}e^{-i\gamma}r_\alpha e^{-i\Phi_\alpha} = r_\alpha^2 = |\alpha|^2,$$

$$|e^{i\gamma}r_\beta e^{i\Phi_\beta}|^2 = |\beta|^2.$$

Thus, there is a global phase-shift degree of freedom in the expression of a state vector that does not affect the measurable properties associated with the state.

The state vector $|\psi\rangle$ can alternately be expressed, using the Bloch-sphere angles shown in FIG. 2D, as:

$$|\psi\rangle = \cos\frac{\theta}{2}|0\rangle + e^{i\varphi}\sin\frac{\theta}{2}|1\rangle.$$

A derivation of this expression from the previously presented expression $|\psi\rangle = r_\alpha e^{i\Phi_\alpha}|0\rangle + r_\beta e^{i\Phi_\beta}|1\rangle$ for the state vector $|\psi\rangle$ follows:

$$e^{-i\varphi_\alpha}|\psi\rangle = e^{-i\varphi_\alpha}r_\alpha e^{i\varphi_\alpha}|0\rangle + e^{i\varphi_\alpha}r_\beta e^{i\varphi_\beta}|1\rangle,$$
$$= r_\alpha|0\rangle + r_\beta e^{i(\varphi_\beta - \varphi_\alpha)}|1\rangle = r_\alpha|0\rangle + r_\beta e^{i\varphi}|1\rangle,$$

$$|\psi\rangle = r_\alpha|0\rangle + r_\beta e^{i\varphi}|1\rangle,$$

$$x = r \sin\theta\cos\varphi,$$

$$y = r \sin\theta\sin\varphi,$$

$$z = r \cos\theta,$$

$$r = 1, r_\alpha \to z,$$

$$|\psi\rangle = \cos\theta|0\rangle + e^{i\varphi}\sin\theta|1\rangle,$$

$$\theta' = 2\theta,$$

$$|\psi\rangle = \cos\left(\frac{\theta'}{2}\right)|0\rangle + e^{i\varphi}\sin\left(\frac{\theta'}{2}\right)|1\rangle.$$

The derivation uses a global phase factor to remove a phase coefficient from one of the terms and then employs spherical coordinate representations of the orthonormal axes x, y, and z as well as several substitutions to produce the final expression.

In the current discussion, a qubit is treated as a mathematical object with the above-described properties. However, these mathematically-described qubits correspond to actual physical hardware qubits that can be implemented using a number of different physical implementations, including trapped ions, optical cavities, and individual elementary particles, molecules, or aggregations of molecules that exhibit qubit behavior.

Various different primitive operations, corresponding to logic circuits in a digital computer and to computer instructions that control operation of logic circuits, can be performed on classical bits to produce classical bits with possibly altered state values. These primitive operations are referred to as "gates." For example, when a signal corresponding to the state of a first bit is passed through a NOT gate and stored in a second classical bit, the state of the second classical bit is opposite from the state of the first classical bit. In fact, the NOT gate is the only fundamental, non-trivial, traditional, classical computing gate with a single-bit input and a single-bit output. By contrast, there are an infinite number of possible single-qubit quantum gates that change the state vector of a qubit. As can be seen in FIG. 2D, changing the state of a qubit essentially involves changing the direction of the state vector or, in other words, selecting a new direction for the state vector from among an infinite number of directions. Changing the state of a qubit state vector is therefore referred to as a "rotation." A rotation, state change, or single-qubit quantum-gate operation is represented mathematically by a unitary 2×2 matrix with complex elements:

$$\begin{bmatrix} a & b \\ -b^* & a^* \end{bmatrix}$$

where a, b ∈ ℂ and the notation "x*" indicates the complex conjugate of x. A unitary 2×2 matrix X with complex elements can be defined as a 2×2 matrix X with the following property:

$$X^\dagger X = XX^\dagger = I = \begin{bmatrix} 1 & 0 \\ 0 & 1 \end{bmatrix}$$

where $$X^\dagger = \begin{bmatrix} a^* & -b \\ b^* & a \end{bmatrix}.$$

The adjoint $X^\dagger$ of a unitary matrix X is the conjugate transpose of the unitary X. The fact that multiplication of the adjoint unitary operation by the unitary operation, or vice versa, produces the identity operator Id, or identity matrix I, can be seen by:

$$\begin{bmatrix} a^* & -b \\ b^* & a \end{bmatrix}\begin{bmatrix} a & b \\ -b^* & a^* \end{bmatrix} = \begin{bmatrix} a^*a + bb^* & a^*b - ba^* \\ ab^* - ab^* & bb^* + aa^* \end{bmatrix} = \begin{bmatrix} 1 & 0 \\ 0 & 1 \end{bmatrix}$$

since $$a^*a + bb^* = |a|^2 + |b|^2 = 1.$$

Thus, the operation of a quantum gate on a qubit with state $|\psi\rangle$, where $|\psi\rangle$ is expressed in vector form as $$|\psi\rangle = \begin{bmatrix} \alpha \\ \beta \end{bmatrix},$$

can be expressed as left-hand multiplication of the state vector by the unitary matrix corresponding to the unitary operation:

$$\begin{bmatrix} a & b \\ -b^* & a^* \end{bmatrix}\begin{bmatrix} \alpha \\ \beta \end{bmatrix} = \begin{bmatrix} a\alpha + b\beta \\ -b^*\alpha + a^*\beta \end{bmatrix} = \begin{bmatrix} \alpha' \\ \beta' \end{bmatrix}.$$

In the current discussion, all of the quantum gates and quantum circuits are single-qubit quantum gates and quantum circuits, and therefore are assumed to have 2×2 complex matrix representations.

Figure 3:
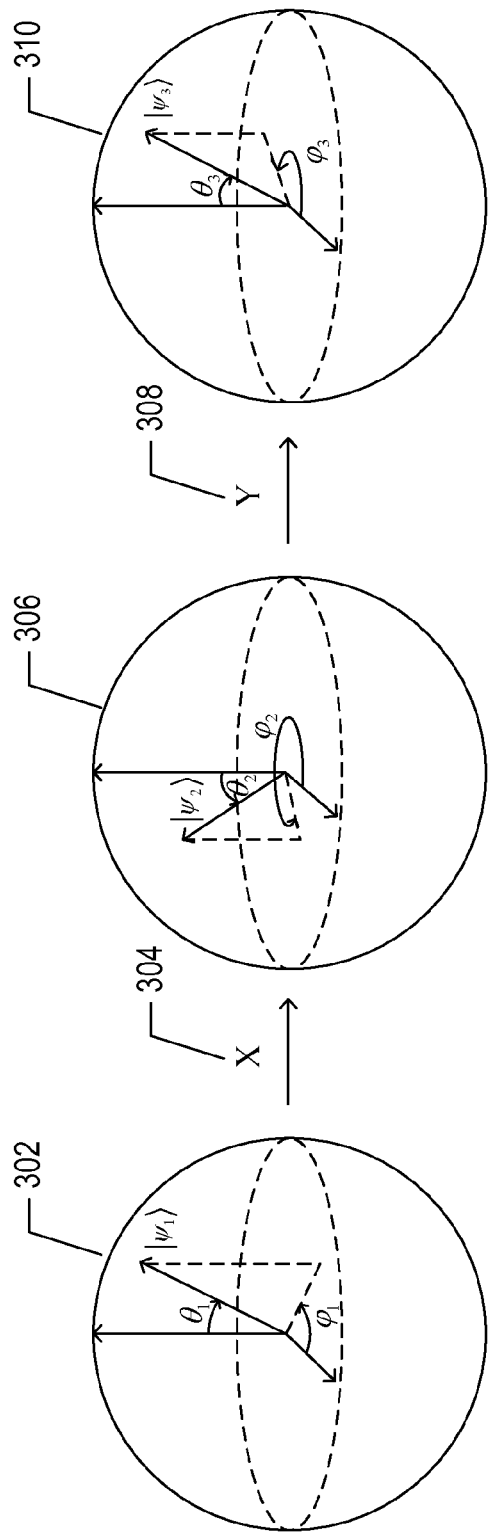
FIG. 3 illustrates a quantum circuit comprising two quantum gates.

FIG. 3 illustrates a quantum circuit comprising two quantum gates. In FIG. 2, a qubit in a first state $|\psi_1\rangle$, represented by the Bloch sphere 302, is transformed by unitary operation X 304 to a qubit in state $|\psi_2\rangle$, as represented by Bloch sphere 306, which is, in turn, transformed by unitary operation Y 308 to place the qubit in state $|\psi_3\rangle$, as represented by Bloch sphere 310. This quantum circuit can be represented as the gate sequence XY which transforms the qubit as follows:

$$\begin{array}{cc} X & |\psi_1\rangle \\ \begin{bmatrix} X_{11} & X_{12} \\ X_{21} & X_{22} \end{bmatrix} \begin{bmatrix} \alpha_1 \\ \beta_1 \end{bmatrix} \rightarrow \begin{bmatrix} X_{11}\alpha_1 + X_{12}\beta_1 \\ X_{21}\alpha_1 + X_{22}\beta_1 \end{bmatrix} = \begin{bmatrix} \alpha_2 \\ \beta_2 \end{bmatrix} \end{array}$$

$$\begin{array}{cc} Y & |\psi_2\rangle \\ \begin{bmatrix} Y_{11} & Y_{12} \\ Y_{21} & Y_{22} \end{bmatrix} \begin{bmatrix} \alpha_2 \\ \beta_2 \end{bmatrix} \rightarrow \begin{bmatrix} Y_{11}\alpha_2 + Y_{12}\beta_2 \\ Y_{21}\alpha_2 + Y_{22}\beta_2 \end{bmatrix} = \end{array}$$

$$= |\psi_3\rangle$$
$$\begin{bmatrix} Y_{11}(X_{11}\alpha_1 + X_{12}\beta_1) + Y_{12}(X_{21}\alpha_1 + X_{22}\beta_1) \\ Y_{21}(X_{11}\alpha_1 + X_{12}\beta_1) + Y_{22}(X_{21}\alpha_1 + X_{22}\beta_1) \end{bmatrix} = \begin{bmatrix} \alpha_3 \\ \beta_3 \end{bmatrix}$$

Alternatively, one can multiply the two matrices representing operations X and Y together to produce matrix Z, and then left-hand multiply state vector $|\psi_1\rangle$ by Z to produce the same result:

$$\begin{array}{ccc} X & Y & Z \\ \begin{bmatrix} X_{11} & X_{12} \\ X_{21} & X_{22} \end{bmatrix} \begin{bmatrix} Y_{11} & Y_{12} \\ Y_{21} & Y_{22} \end{bmatrix} = \begin{bmatrix} X_{11}Y_{11} + X_{12}Y_{21} & X_{11}Y_{12} + X_{12}Y_{22} \\ X_{21}Y_{11} + X_{22}Y_{21} & X_{21}Y_{12} + X_{22}Y_{22} \end{bmatrix} \end{array}$$

$$\begin{array}{cc} Z & |\psi_1\rangle \\ \begin{bmatrix} X_{11}Y_{11} + X_{12}Y_{21} & X_{11}Y_{12} + X_{12}Y_{22} \\ X_{21}Y_{11} + X_{22}Y_{21} & X_{21}Y_{12} + X_{22}Y_{22} \end{bmatrix} \begin{bmatrix} \alpha_1 \\ \beta_1 \end{bmatrix} = \end{array}$$

-continued $$\begin{bmatrix} \alpha_1(X_{11}Y_{11} + X_{12}Y_{21}) + \beta_1(X_{11}Y_{12} + X_{12}Y_{22}) \\ \alpha_1(X_{21}Y_{11} + X_{22}Y_{21}) + \beta_1(X_{21}Y_{12} + X_{22}Y_{22}) \end{bmatrix} = \begin{bmatrix} \alpha_3 \\ \beta_3 \end{bmatrix} \overset{|\psi_3\rangle}{.}$$

A quantum circuit can therefore be specified as a sequence of quantum gates in which the quantum gates are symbolically represented or, equivalently, numerically represented. There are several ways to look at a quantum circuit. One can, as discussed above, multiply the matrices corresponding to the component quantum gates together in the order specified by the symbol sequence to produce a final, resultant, 2×2 complex matrix that represents the same state change, in a single operation or quantum gate, corresponding to the state change produced by sequential application of the quantum gates specified in the original symbol sequence. A quantum circuit can be viewed as a design for an actual hardware circuit in a quantum computer, where the hardware circuit needs to perform the operation specified by the single-gate representation of the quantum circuit, or can be viewed as a quantum-computing program, in which operations corresponding to the sequence of quantum gates represented by the symbol sequence are applied to a qubit in order to produce a final qubit state.

The term "quantum circuit" is thus somewhat interchangeable with the term "quantum gate," as a quantum circuit can be expressed as a resultant operator. However, symbolically represented quantum circuits are useful in quantum circuit design for many reasons, including the fact that it is quite difficult to design and implement arbitrary physical quantum gates, but far easier to design and implement certain standard quantum gates, several of which are shown below. A symbolic representation using implementable quantum gates can thus represent a feasible design for hardware or a control program that produces the result that would be produced by the quantum-gate resultant obtained by multiplying the sequence of standard quantum gates. In addition, quantum circuits symbolically represented as sequences of standard gates do not necessarily map with uniform density to the set of arbitrary quantum gates, and finding a standard-gate implementation working back from a desired quantum gate is generally not a computationally tractable problem.

Methods and Systems Disclosed in the Current Application

The current application is directed to methods and systems for representing quantum circuits using the three fundamental quantum gates, H, T, and S:

$$H = \begin{bmatrix} \frac{i}{\sqrt{2}} & \frac{i}{\sqrt{2}} \\ \frac{i}{\sqrt{2}} & -\frac{i}{\sqrt{2}} \end{bmatrix}$$

$$T = \begin{bmatrix} e^{-i\frac{\pi}{8}} & 0 \\ 0 & e^{i\frac{\pi}{8}} \end{bmatrix}$$

$$S = \begin{bmatrix} e^{-i\frac{\pi}{4}} & 0 \\ 0 & e^{i\frac{\pi}{4}} \end{bmatrix} = TT.$$

Multiplying quantum gate H by itself generates the identity matrix I or, equivalently, the Id operation:

$$HH = \begin{bmatrix} \frac{i}{\sqrt{2}} & \frac{i}{\sqrt{2}} \\ \frac{i}{\sqrt{2}} & -\frac{i}{\sqrt{2}} \end{bmatrix}$$

$$\begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} -1 & 0 \\ 0 & -1 \end{bmatrix} = e^{i\pi}\begin{bmatrix} 1 & 0 \\ 0 & 1 \end{bmatrix} = \begin{bmatrix} 1 & 0 \\ 0 & 1 \end{bmatrix} = I$$

where a global phase-shift multiplier is disregarded, as discussed above. The number of times that a quantum gate or operator is multiplied by itself to generate the identity operation Id is the algebraic order of the quantum gate. Thus, the algebraic order of quantum gate H is 2. The algebraic order of the quantum gate T is 8:

$$TTTTTTTT = \begin{bmatrix} 1 & 0 \\ 0 & 1 \end{bmatrix}$$

Two additional quantum gates employed in currently disclosed methods and systems include SH and TH, each binary compositions of two of the above-mentioned quantum gates H, T, and S:

$$SH = \begin{bmatrix} e^{-i\frac{\pi}{4}} & 0 \\ 0 & e^{i\frac{\pi}{4}} \end{bmatrix}\begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} \frac{e^{i\frac{\pi}{4}}}{\sqrt{2}} & \frac{e^{i\frac{\pi}{4}}}{\sqrt{2}} \\ \frac{ie^{i\frac{\pi}{4}}}{\sqrt{2}} & \frac{-ie^{-i\frac{\pi}{4}}}{\sqrt{2}} \end{bmatrix} = \begin{bmatrix} \frac{i+1}{2} & \frac{i+1}{2} \\ \frac{i+1}{2} & \frac{-i+1}{2} \end{bmatrix}$$

$$TH = \begin{bmatrix} e^{-i\frac{\pi}{8}} & 0 \\ 0 & e^{-i\frac{\pi}{8}} \end{bmatrix}\begin{bmatrix} \frac{i}{\sqrt{2}} & \frac{i}{\sqrt{2}} \\ \frac{i}{\sqrt{2}} & -\frac{i}{\sqrt{2}} \end{bmatrix} = \begin{bmatrix} \frac{e^{i\frac{5\pi}{8}}}{\sqrt{2}} & \frac{e^{i\frac{5\pi}{8}}}{\sqrt{2}} \\ \frac{e^{i\frac{3\pi}{8}}}{\sqrt{2}} & \frac{-e^{-i\frac{3\pi}{8}}}{\sqrt{2}} \end{bmatrix}.$$

The algebraic order of the quantum gate TH is infinite, while the algebraic order of the quantum gate SH is 3, as shown by:

$$SHSH = \begin{bmatrix} \frac{i+1}{2} & \frac{i+1}{2} \\ \frac{i-1}{2} & \frac{-i+1}{2} \end{bmatrix}\begin{bmatrix} \frac{i+1}{2} & \frac{i+1}{2} \\ \frac{i-1}{2} & \frac{-i+1}{2} \end{bmatrix} = \begin{bmatrix} \frac{i-1}{2} & \frac{i+1}{2} \\ \frac{i-1}{2} & \frac{-i-1}{2} \end{bmatrix}$$

$$SHSHSH = \begin{bmatrix} \frac{i-1}{2} & \frac{i+1}{2} \\ \frac{i-1}{2} & \frac{-i-1}{2} \end{bmatrix}$$

$$\begin{bmatrix} \frac{i+1}{2} & \frac{i+1}{2} \\ \frac{i-1}{2} & \frac{-i+1}{2} \end{bmatrix} = \begin{bmatrix} -1 & 0 \\ 0 & -1 \end{bmatrix} \xrightarrow{phase\ change} \begin{bmatrix} 1 & 0 \\ 0 & 1 \end{bmatrix}.$$

All of the possible 2×2 unitary matrices corresponding to rotations of state vectors in dual inner-product spaces defined by two orthonormal basis vectors form an infinite group referred to as U(2). The group is infinite because the 2×2 unitary matrices are defined in terms of two complex numbers, of which there are an infinite number of pairs that meet the above-discussed constraints for rotation matrices. Consider the phase-rotation matrices with general form:

$$\begin{bmatrix} e^{i\theta} & 0 \\ 0 & e^{i\theta} \end{bmatrix} = e^{i\theta}\begin{bmatrix} 1 & 0 \\ 0 & 1 \end{bmatrix}$$

where θ is an arbitrary real angle. When one of these matrices, or operations, multiplies any element of U(2), the resultant operator applied to an initial state vector produces a transformed state vector with the same squared absolute values of the state-vector components α and β as those for a transformed state vector produced by applying the original element of U(2) operator to the initial state vector, as can be seen from:

$$\begin{bmatrix} a & b \\ -b^* & a^* \end{bmatrix}\begin{bmatrix} \alpha \\ \beta \end{bmatrix} = \begin{bmatrix} a\alpha + b\beta \\ -b^*\alpha + a^*\beta \end{bmatrix} = \begin{bmatrix} \alpha' \\ \beta' \end{bmatrix}$$

$$\begin{bmatrix} e^{i\varphi} & 0 \\ 0 & e^{i\varphi} \end{bmatrix}\begin{bmatrix} a & b \\ -b^* & a^* \end{bmatrix}$$

$$\begin{bmatrix} \alpha \\ \beta \end{bmatrix} = \begin{bmatrix} e^{i\theta}a & e^{i\theta}b \\ -e^{i\theta}b^* & e^{i\theta}a^* \end{bmatrix}\begin{bmatrix} \alpha \\ \beta \end{bmatrix} = \begin{bmatrix} e^{i\theta}(a\alpha + b\beta) \\ -e^{i\theta}(-b^*\alpha + a^*\beta) \end{bmatrix} = \begin{bmatrix} \alpha'' \\ \beta'' \end{bmatrix}$$

$$|\alpha''|^2 = e^{i\theta}e^{-i\theta}|\alpha'|^2 = |\alpha'|^2$$

$$|\beta''|^2 = e^{i\theta}e^{-i\theta}|\beta'|^2 = |\beta'|^2$$

Thus, the global phase-rotation matrices do not affect the observable values associated with qubit state vectors. There are an infinite number of global phase-rotation matrices, or operators, that are members of U(2). These global phase-rotation matrices, or operators, form an infinite subgroup of U(2) that is referred to as GPh:

$$GPh = \left\{ \begin{bmatrix} e^{i\alpha} & 0 \\ 0 & e^{i\alpha} \end{bmatrix}, \begin{bmatrix} e^{i\beta} & 0 \\ 0 & e^{i\beta} \end{bmatrix}, \begin{bmatrix} e^{i\alpha} & 0 \\ 0 & e^{i\alpha} \end{bmatrix}, \ldots \right\}$$

where $\alpha, \beta, \gamma, \ldots \in \mathbb{R}$

The infinite group U(2) can be factored by the subgroup GPh to generate the infinite group PSU(2), where PSU(2) is U(2) modulo GPh:

$$U(2) = [\ldots e^{i\varphi_a}X_j \ldots e^{i\varphi_b}X_j \ldots e^{i\varphi_c}X_j \ldots e^{i\varphi_a}X_k \ldots e^{i\varphi_b}X_k \ldots e^{i\varphi_c}X_k \ldots e^{i\varphi_a}X_l \ldots e^{i\varphi_b}X_l \ldots]$$

$$\frac{U(2)}{GPh} = [\ldots X_j \ldots X_k \ldots X_l \ldots] = PSU(2)$$

The trace of a matrix is the sum of the diagonal elements of the matrix. The traces of all members of U(2) that map to a particular member of PSU(2) by the modulo operation with respect to GPh are identical:

$$tr\left(\begin{bmatrix} e^{i\varphi} & 0 \\ 0 & e^{i\varphi} \end{bmatrix}\begin{bmatrix} a & b \\ -b^* & a^* \end{bmatrix}\right) =$$

-continued $$e^{i\varphi}tr\left(\begin{bmatrix} a & b \\ -b^* & a^* \end{bmatrix}\right) = tr\left(\begin{bmatrix} a & b \\ -b^* & a^* \end{bmatrix}\right) \text{ since } |e^{i\varphi}| = 1.$$

It is well known that the group of symbolic representations of quantum circuits generated by the quantum-gate basis <H,T>, where H and T are two of the quantum-gate operators discussed above, is everywhere dense in PSU(2). The infinite group of symbolic representations of quantum circuits generated by the basis <H,T> is:

$$\langle H, T\rangle \to \begin{bmatrix} T, TT, TH, TTT, TTH, THT, THH, \ldots, \\ H, HT, HH, HTT, HTH, HHT, HHH, \ldots \end{bmatrix} = U_{\langle H,T\rangle}.$$

Figure 4A:
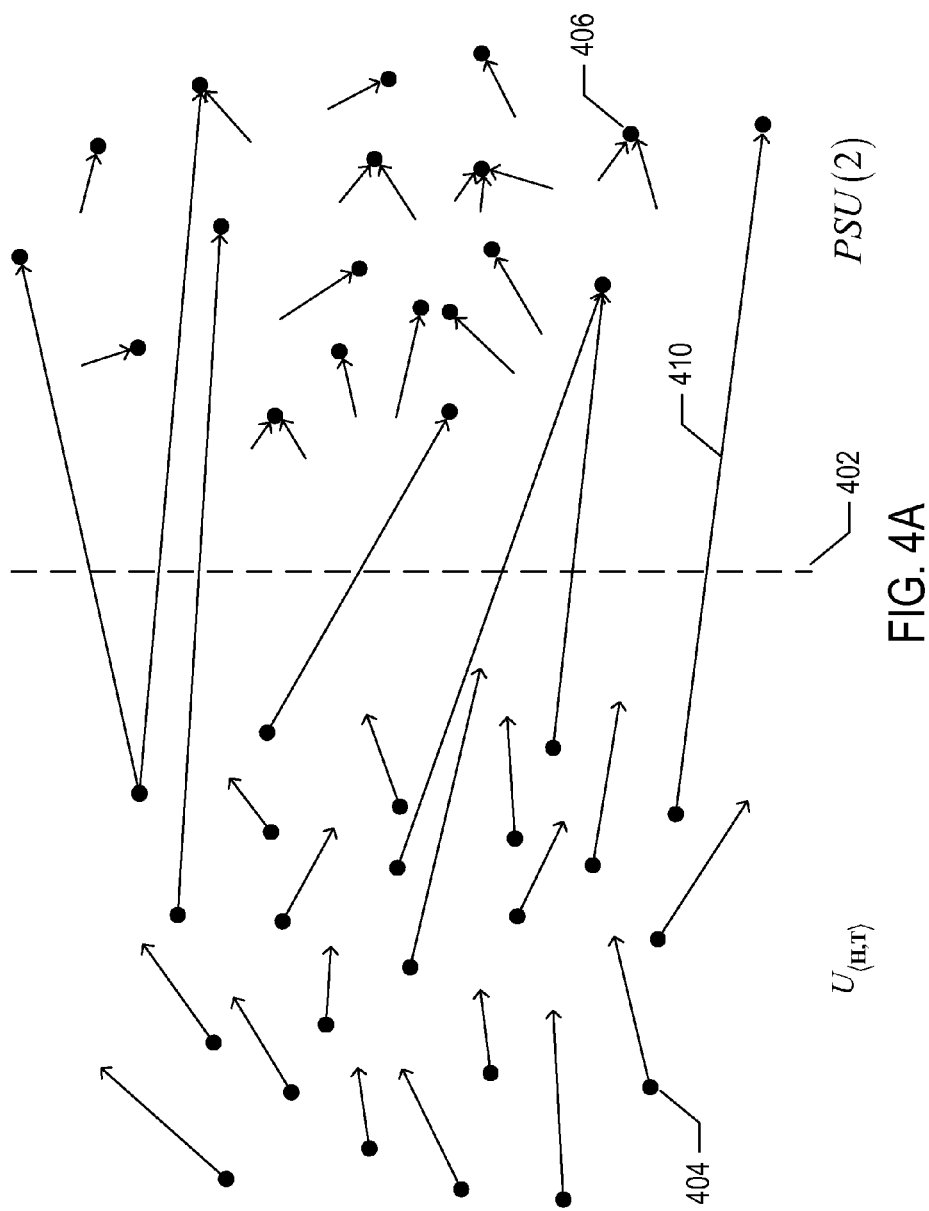
FIGS. 4A-B illustrate what it means for $U_{<H,T>}$ to be everywhere dense in PSU(2).
Figure 4B:
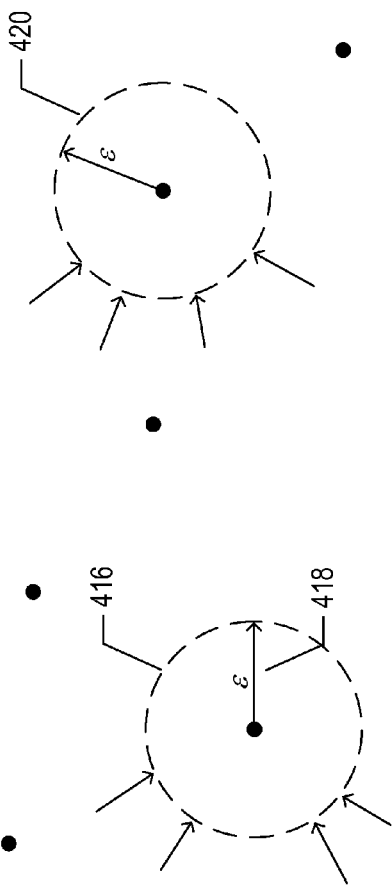

FIGS. 4A-B illustrate what it means for $U_{<H,T>}$ to be everywhere dense in PSU(2). In FIG. 4A, a vertical dashed line 402 separates points representing elements of $U_{<H,T>}$, such as point 404, on the left side of the dashed line 402, from points representing elements of PSU(2), such as point 406, on the right side of the dashed vertical line 402. Because both PSU(2) and $U_{<H,T>}$ are infinite groups, only a small number of representative points are shown for both groups, in FIGS. 4A-B. Consider a mapping of elements from $U_{<H,T>}$ to equivalent elements of PSU(2), represented by arrows, such as arrow 410, in FIG. 4A. Because both $U_{<H,T>}$ and PSU(2) are infinite groups, a mapping cannot be enumerated. However, it can be shown, as illustrated in FIG. 4B, that if one selects a neighborhood in PSU(2) around any element in PSU(2), such as the neighborhood 416 represented by the dashed circle in FIG. 4B defined by the radius ε 418, and selects a similarly sized neighborhood 420 about another element in PSU(2), an equal number of elements in $U_{<H,T>}$ map to elements within the two neighborhoods 416 and 420. This, in turn, implies that, for any unitary circuit u in PSU(2) and for any distance-metric value ε>0, there exists a circuit if in $U_{<H,T>}$ such that the distance between u' and u is less than ε. In other words, any quantum circuit in PSU(2) can be approximated as closely as desired by a corresponding quantum circuit generated only from H and T quantum gates. The quantum circuits in $U_{<H,T>}$ can be expressed and represented as sequences of H and T symbols. Various different distance metrics for the distance between quantum circuits u' and u can be used, such as the metric:

$$dist(u',u) = \sqrt{(2-|tr(u' \cdot u^\dagger)|)/2}$$

where $u^\dagger$ is the adjoint, or complex-conjugate transpose, of u.

It is generally a difficult problem to implement an arbitrary quantum circuit u selected from PSU(2). However, the fact that an arbitrary quantum gate u can be approximated, to any desired level of approximation, by a quantum circuit u' selected from $U_{<H,T>}$ provides a direction for automating the determination of practically implementable and efficient quantum circuits. For example, the members of $U_{<H,T>}$ that can be represented by symbol strings of up to some maximum length can be compiled into a database, and the quantum-circuit design problem can be transformed into a problem of searching the database for a minimum-cost circuit u'∈U$_{<H,T>}$ that differs from the desired quantum circuit u∈PSU(2) by less than a threshold distance ϵ. In certain cases, of course, a u'∈U$_{<H,T>}$ can be found that is exactly equivalent to a particular u∈PSU(2). In other cases, because of the finite-length constraint, only an approximate u' can be found. In other words, the searching process can be represented by a function that takes, as parameters, an arbitrary quantum circuit u in PSU(2) and a threshold distance ϵ and returns a set $S_{u \to u'}$ of quantum circuits in U$_{<H,T>}$ that differ from u by less than ϵ:

$$S_{u \to u'} = f(u, \epsilon) \text{ where } u' \in U_{\langle H,T \rangle} \text{ and } u \in PSU(2).$$

Selecting the minimum-cost approximating circuit u' from U$_{<H,T>}$ can then be cast as an optimization problem:

$$S_{opt} = \operatorname*{argmin}_{u' = f(u,\epsilon)} g(u').$$

where g(µ') is a cost function. There are numerous different cost functions that can be used to define the quantum-circuit-design method, including the length, in symbols, of a symbolic representation of the quantum circuit or the number of T gates or T symbols in the symbolic representation of the quantum circuit:

$$g(u') = \text{length}(u'), \text{ or}$$

$$g(u') = \text{number}Tgates(u').$$

There are, however, certain difficulties associated with the above-proposed quantum-circuit design method. One difficulty is that multiple quantum circuits with multiple different symbolic representations of different lengths may represent the same, underlying, simplified quantum circuit. For example, a subsequence of symbols within a symbolic representation of a quantum circuit may represent a sequence of quantum-gate multiplications that result in the identity operation Id or identity matrix I, and thus can be removed from the symbol string without changing the result of applying all the operations in the symbol string to a qubit or, in other words, multiplying all of the quantum gates represented by the symbols in the symbol string together to generate the resultant quantum gate. Therefore, the fact that symbolic representations of different lengths may practically reduce to the same resultant quantum circuit may complicate the above-mentioned search-based approach to quantum-circuit design. A second problem associated with search-based quantum-circuit-design methods is that of partitioning the search problem into independent subtasks that can be efficiently carried out in distributed fashion.

The current application discloses methods and systems of alternative representations of quantum circuits with provable algebraic properties that facilitate implementation of search-based quantum-circuit-design methods and systems. First, a new basis, the <TH,SH> basis, is employed for symbolic quantum-circuit representations:

$$\langle TH, SH \rangle \to \begin{bmatrix} TH, THTH, THSH, THTHTH, THTHSH, THSHTH, \dots, \\ SH, SHTH, SHSH, SHTHTH, SHTHSH, SHTHSH, \dots \end{bmatrix} = U_{\langle TH, SH \rangle}.$$

The TH and SH gates are discussed above. The S gate is far cheaper to implement, in many quantum-computing architectures, than the T gate. Because both the H and T gates can be expressed in the <TH,SH> basis $$H = THSHSHTH,$$

$$T = THTHSHSHTH,$$

U$_{<H,T>}$ maps to U$_{<TH,SH>}$ and vice versa:

$$u' \in U_{\langle H, T \rangle} \leftrightarrow u'' \in U_{\langle TH, SH \rangle}.$$

Because, as discussed above:

$$SH^3 = Id,$$

an arbitrary non-null symbolic circuit in the <TH,SH> basis can be rewritten to include no more than two adjacent SH gates:

u''→u'''=a composition of one or more subcircuits $u_s \in \{SH^l\}$ and $u_t \in \{TH^k\}$ where l∈{1, 2}, k∈{1, 2, . . . }, and the $u_s$ and $u_t$ subcircuits are strictly alternating.

Next, normalized and canonical symbolic forms are described. A normalized-form representation of a quantum circuit in the <TH,SH> basis is either a null string or, in other words, the identity element Id, or a quantum circuit expressed as a sequence of TH and SH gates that contains no adjacent SH gates and that ends in TH:

$$u'' \in \{\emptyset, u'''' \circ TH\}$$

where u''''=a composition of zero or more subcircuits $u_s \in \{SH^l\}$ and $u_t \in \{TH^k\}$, l∈{1}, k∈{1, 2, . . . }, the $u_s$ and $u_t$ subcircuits are strictly alternating, and "∘" is a symbolic-circuit-representation concatenation operator, for which the symbol "+" may alternatively be used.

A symbolic representation of a quantum circuit in the <TH,SH> basis, $u^{cc}$, is in canonical form when the quantum-circuit representation is in normalized form and an SH gate does not occur before the fifth gate of the representation. Thus:

$$u^{cc} = u^h \cdot u^n$$

$$\text{where } u^h \in \left\{ \begin{array}{l} \emptyset, TH, THTH, THTHTH, THTHTHTH, \\ THTHTHTHTH, THTHTHSHTH \end{array} \right\}.$$

Thus, the shortest canonical quantum-circuit symbolic representation that contains the SH gate is the circuit:
THTHTHTHSHTH.

The set N is, in the following discussion, the set of all normalized-form representations in the <TH,SH> basis and the set CC is the set of all canonical-form representations in the <TH,SH> basis:

N is the set of all u''

CC is the set of all $u^{cc}$.

Sets N and CC are both subsets of U$_{<H,T>}$. A quantum-circuit symbolic representation composed of two or more normalized-form representations is also a normalized-form representation and a symbolic quantum-circuit representation composed of two or more canonical-form representations is also a canonical-form representation:

$$N \subset U_{\langle H, T \rangle}$$

$$CC \subset U_{\langle H, T \rangle}$$

u$^{n'}$ composed of one or more u''∈N u$^{cc'}$ composed of one or more $u^{cc}$∈CC.

When a canonical-form quantum-circuit symbolic representation has a length, in SH and TH gates, greater than 3, then a quantum-circuit symbolic representation obtained by appending the canonical-form quantum-circuit symbolic representation with a normalized-form quantum-circuit symbolic representation is canonical:

$$\forall u^{cc}: \text{length\_in\_}SH\_\text{and\_}TH\_\text{gates}(u^{cc}) > 3, u^{cc} \circ u^n \in CC.$$

Figure 5B:
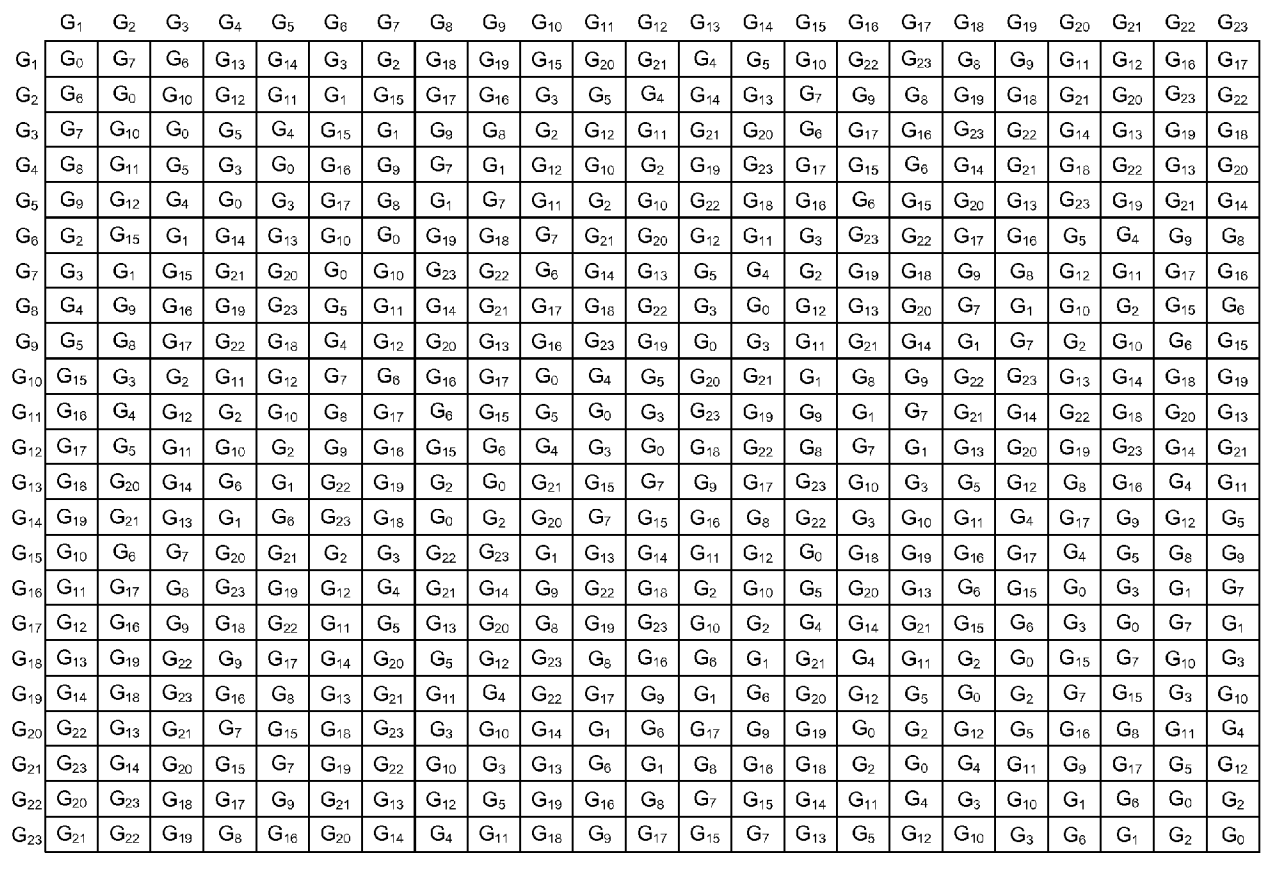

There is a relatively small subgroup, referred to as CPH and generated by the <H,S> basis, which is a subset of $U_{<H,T>}$. This subgroup has only 24 elements. FIGS. 5A-C illustrate the group CPH. FIG. 5A shows, in tabular form, the elements of the group CPH using the notation $G_x$, where x is an integer in $\{0, 1, \ldots, 23\}$, paired with symbolic representations in the <H,S> basis. FIG. 5B provides a group-multiplication table for the group CPH, and FIG. 5C provides a set of commutation rules for commuting an element of the group CPH with the gate T. Group multiplication of any two elements $G_x$ and $G_y$ of the group CPH generates an element of CPH according to the multiplication rules shown in FIG. 5B. As shown in FIG. 5C, an equivalent symbolic representation of $G_xT$, where G, is a symbolically represented element of CPH, can be rewritten as one of $TG_y$, $HTG_y$, or $HSHTG_y$.

Symbolic representations of elements of the group CPH, shown in FIG. 5A, can be composed with a normalized-form representation of a quantum circuit in the <TH,SH> basis to generate any element in $U_{<H,T>}$, and symbolic representations of elements of the group CPH can be combined with a canonical-form symbolic representation in the <TH,SH> basis to generate any element of $U_{<H,T>}$. An arbitrary circuit u' in the <H,T> basis can be mapped to a composition of a normalized-form symbolic representation and one or two symbolic representations of elements of CPH:

$$u' \in U_{<H,T>} \to u^n g \text{ and/or } Hu^n g$$

where $g \in CPH, u^n \in N$. Such compositions are referred to as "normal representations." This implies that the cardinality of $U_{<H,T>}$ is at most 48 times greater than the cardinality of the set of normalized-form symbolic representations:

$$|U_{<H,T>}| <= |H \text{ or no } H||N||CPH| <= 2 \cdot |N| \cdot 24 \leq 48|N|.$$

Similarly, an arbitrary circuit u' in the <H,T> basis can be alternatively symbolically represented as a composition of two symbolic representations of CPH-group members and a canonical-form symbolic representation:

$$u' \in U_{<H,T>} \to g_1 u^{cc} g_2$$

where $g_1, g_2 \in CPH, u^{cc} \in CC$.
This implies that the cardinality of $U_{<H,T>}$ is no greater than 576 times the cardinality of CC:

$$|U_{<H,T>}| <= |CPH||CC||CPH| \leq 24 \cdot |CC| \cdot 24 \leq 576|CC|.$$

Because any circuit in $U_{<H,T>}$ can be represented both as a normal representation and as a canonical-form representation, a given normal representation can be converted to an equivalent canonical representation with an identical number of TH gates and a given canonical representation can be converted to an equivalent normal representation with an identical number of TH gates.

These properties suggest that the canonical-form quantum-circuit representations can be used as the basis for a database of symbolic representations equivalent to symbolic representations in the <H,T> basis and that conversion of symbolic circuit representations to normal representations can be used to obtain the minimum-cost quantum-circuit designs for arbitrary quantum circuits in PSU(2). Thus, an automated method for mapping circuit representations in the <H,T> basis to equivalent normal representations provides a basis for efficient search-based quantum-circuit-design methods and systems.

Figure 6A:
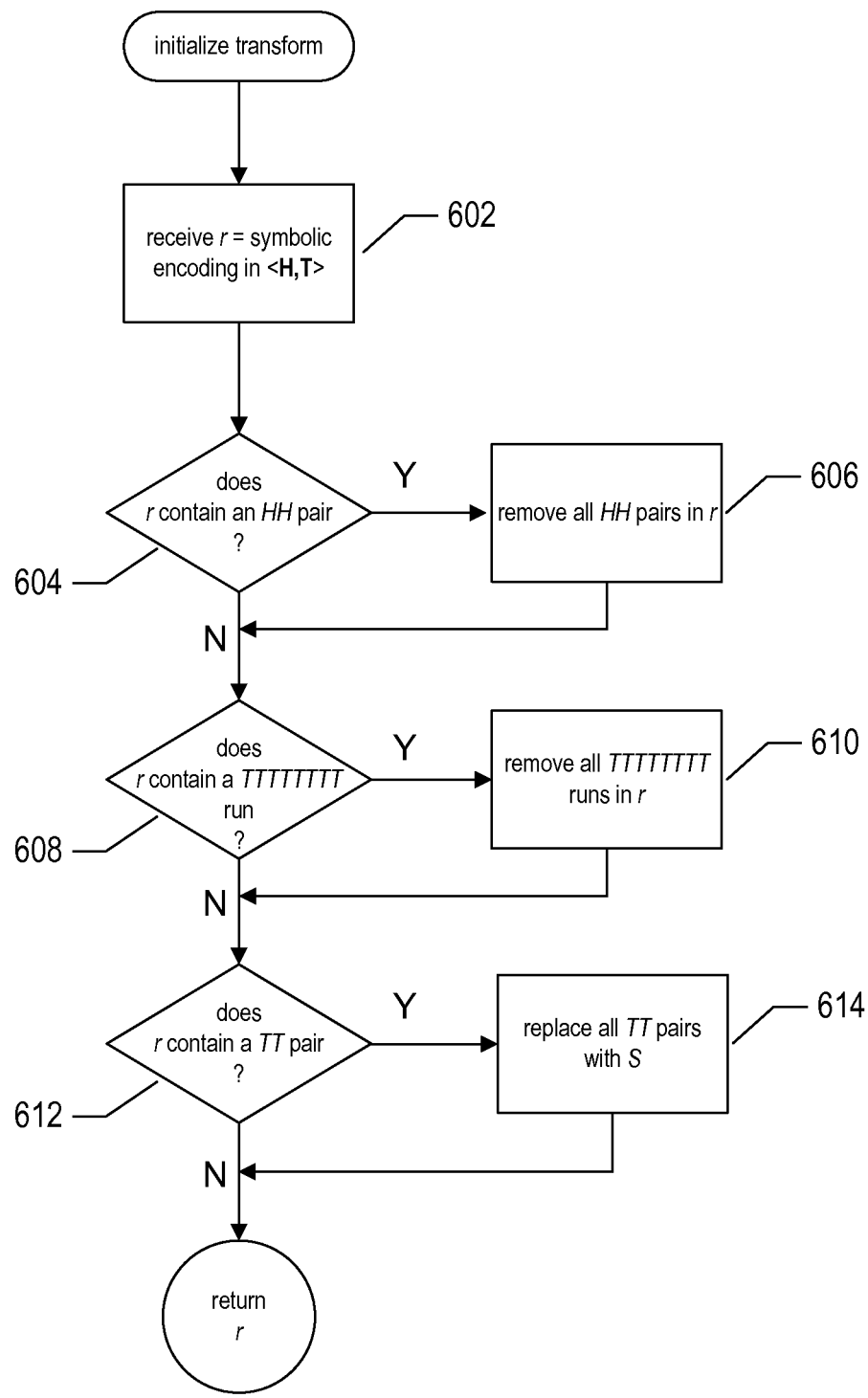
FIGS. 6A-F illustrate a process by which an arbitrary symbolic representation of a quantum circuit in the <H,T> basis is transformed to a normal representation.

FIGS. 6A-F illustrate a process by which an arbitrary symbolic representation of a quantum circuit in the <H,T> basis is transformed to a normal representation, $\mu^n g$ or $H\mu^n g$. FIG. 6A shows an implementation of an initial transform that transforms an input symbolic representation into an equivalent symbolic representation in which symbolic representations of Clifford-group members, or CPH-group members, are interleaved with T gates, with the resultant symbolic representation including an initial Clifford-group representation and a final Clifford-group representation. The circuit output from the initial-transform routine is therefore a symbolic representation of a circuit in the form:

$$u = \left(\prod_{i=1}^{k-1} g_i T\right) g_k$$

where k>0, $g_k \in CPH$, and $\forall l: 1 < l < k, g_l \neq Id$.

In step 602, a symbolic circuit r represented in the <H,T> basis is received. In step 604, the initial-transform routine determines whether r contains any HH pairs. When r contains at least one HH pair, then each HH pair encountered in a left-to-right scan of r is removed, in step 606, because an HH pair is equivalent to the identity operator Id. By removing HH pairs from r, r is transformed into single H symbols interleaved with runs of T symbols. Similarly, in steps 608 and 610, all runs of eight or more consecutive T gates are removed. Finally, in steps 612 and 614, a sequential scan of the symbolic representation r replaces any pair of T gates with an S gate. After this step, r is transformed into single T symbols interleaved with groups of symbols in the <H,S> basis. By considering the possible groups, it is easily observed that these groups are necessarily symbolic representations of Clifford-group elements.

Figure 6B:
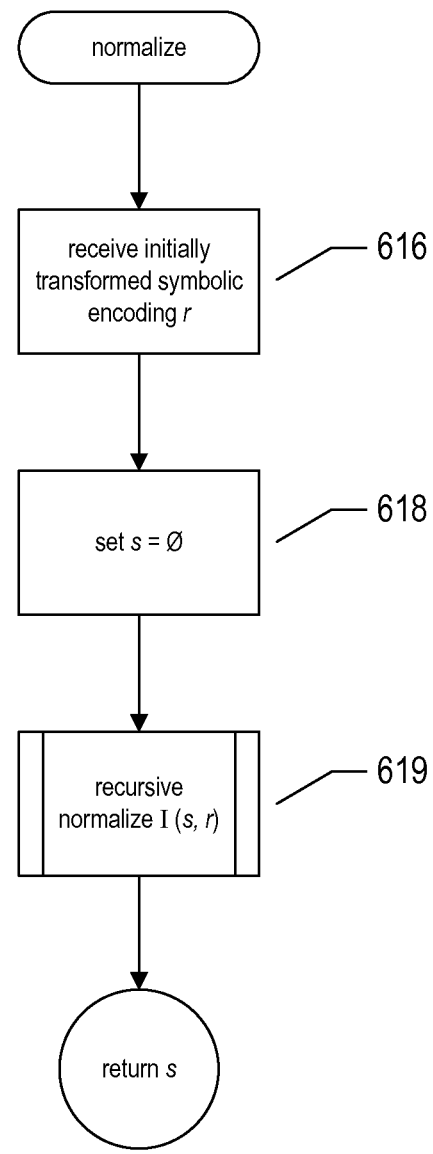
Figure 6C:
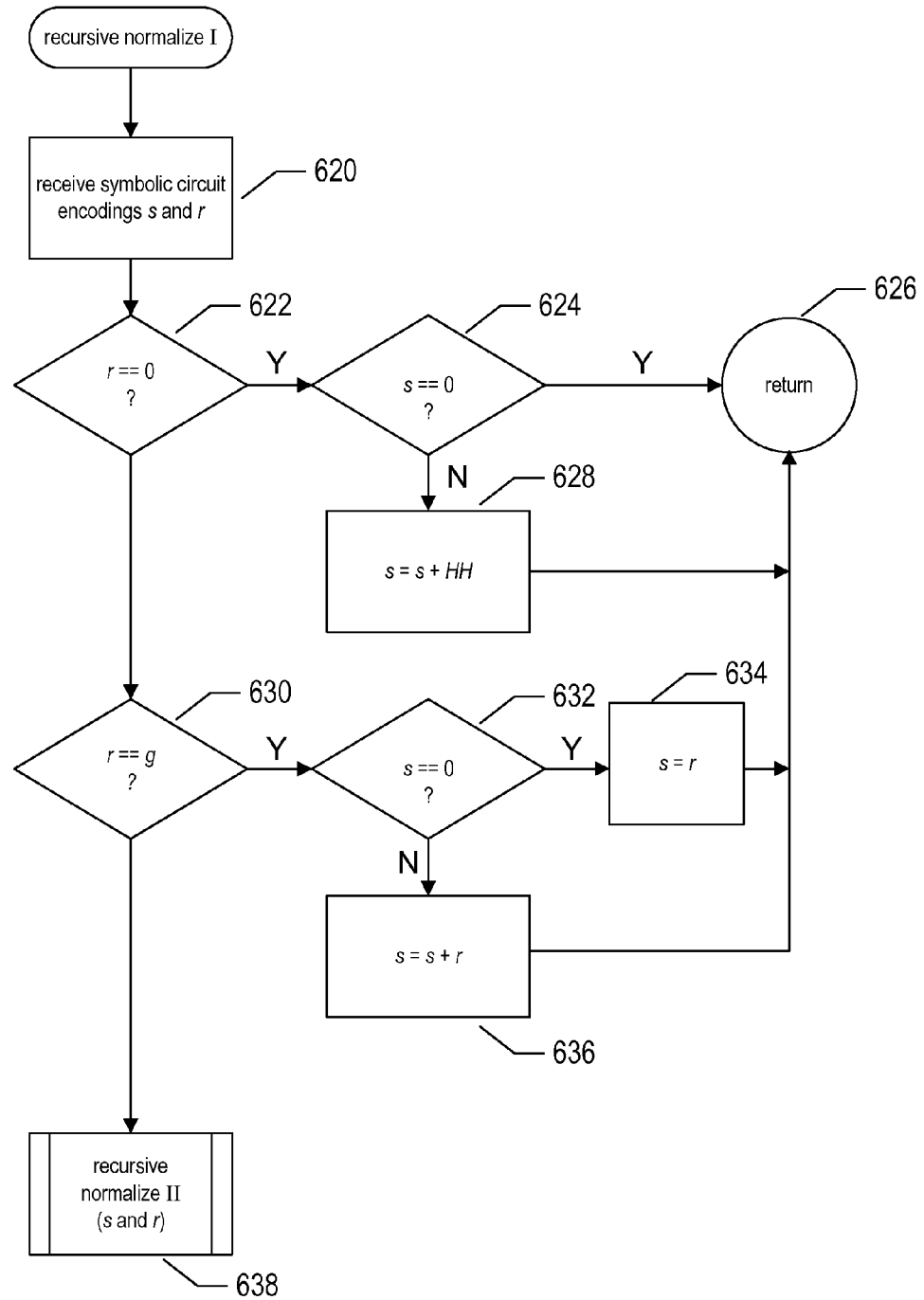

Next, the routine "normalize," control-flow diagrams for which are provided in FIGS. 6B-C, can be applied to the output of the initial transform illustrated in FIG. 6A to produce an equivalent normal representation of the symbolic representation input to the initial-transform routine. In step 616 of FIG. 6B, a symbolic quantum-circuit representation r output from the initial-transform routine illustrated in FIG. 6A is received. In step 618, a symbolic circuit representation, s, is initialized to the null circuit. Then, in step 619, the recursive routine "recursive normalize I" is called with the symbolic circuit representations s and r passed as parameters. The circuit representation s, returned by the routine "recursive normalize," is a normal representation of the input circuit r.

FIG. 6C shows a first part of the recursive normalize routine, "recursive normalize I," called in step 619 of FIG. 6B. At every point at which this routine is called, the symbolic circuit representation s, received in step 620 is either null or ends in the symbol T. Similarly, at every point at which the routine "recursive normalize I" is called, the symbol circuit representation r is either null, is the symbolic representation of a single Clifford gate g, or has a form gTr'. Note that, in these diagrams, g is used interchangeably to represent both a symbolic representations of a Clifford gate as well as for Clifford-group elements. The routine "recursive normalize I" is the first part of an entire recursive normalization routine that is broken up into five parts to facilitate illustration.

In the routine "recursive normalize I," several simple cases are handled. When r is null, as determined in step 622, and when s is also null, as determined in step 624, then the recursive normalization routine returns, in step 626. When r is null and s is not null, then is set to s∘HH, in step 628, following which the recursive normalization routine returns. Otherwise, when r is a symbolic representation of a single Clifford gate, as determined in step 630, and when s is null, as determined in step 632, s is set to r in step 634 and the routine "recursive normalize I" returns in step 626. When r is equal to a single Clifford gate and s is not null, then s is set to s∘r, in step 636, and the routine returns in step 626. When none of the simple cases are present, then the second part of the recursive normalization routine, "recursive normalize II," is called in step 638.

Figure 6D:
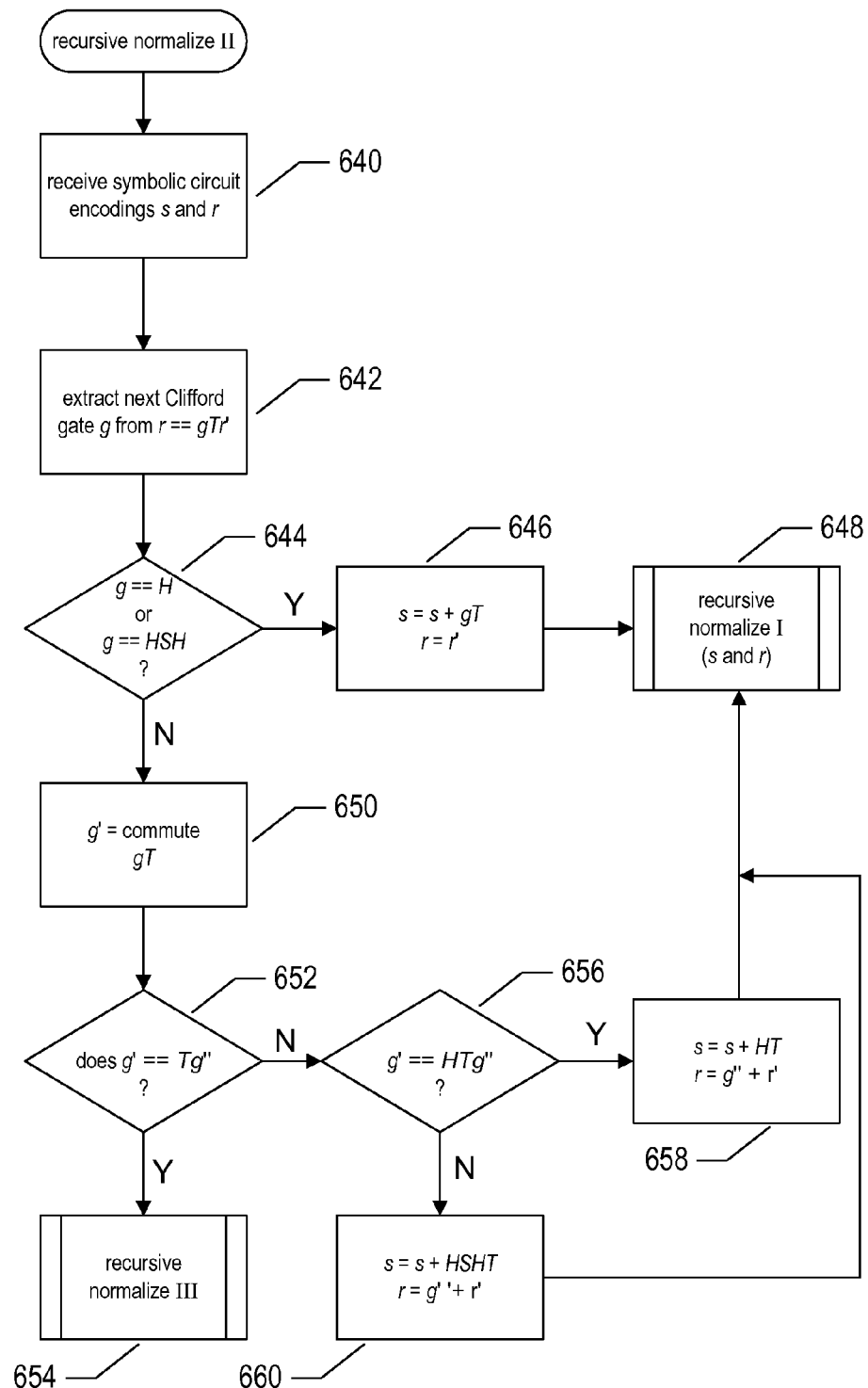

FIG. 6D provides a control-flow diagram for the routine "recursive normalize II" called in step 638 of FIG. 6C. In the routine "recursive normalize I," cases in which r is null or equal to a single Clifford-gate symbolic representation are handled. At the beginning of the routine "recursive normalize II," s may either be null or have the form s'T and r has the form gTr'. In step 640, s and r are again received. This step is a product of splitting the recursive normalization routine into parts, and is included in this control-flow diagram and the two remaining control-flow diagrams for the sake of completeness only. In step 642, the next Clifford gate g is extracted from r. When g is equal to H or HSH, as determined in step 644, then s is set to s∘gT and r is set to r', in step 646, and the recursive normalization function is recursively called in step 648. Appending either of the two Clifford-group symbolic representations HT and HSHT to s and removing the same symbolic representation from r leaves s and r in states appropriate for a next call to the routine "recursive normalize I."

When g is neither H nor HSH, then g is commuted with T, using one of the commutation relations shown in FIG. 5C, to g' in step 650. When g' has the fowl Tg", as determined in step 652, then the routine "recursive normalize III" is called, in step 654. Otherwise, when g' has the form HTg", as determined in step 656, then s is set to s∘HT and r is set to g"∘r', in step 658, and a recursive call to the recursive normalization routine is made in 648. Otherwise, when g' is equal to HSHTg", then s is set to s∘HSHT and r is set to g"∘r', in step 660, after which a recursive call to the recursive normalization routine in step 648 is made. Following application of the commutation relation, in step 650, g' has one of the three forms Tg", HTg" or HSHTg". The last two cases, handled in the routine "recursive normalize II," are readily handled by moving either HT or HSHT from the head of r to the tail of s. The final case, however, is more complex, and is handled in the routine "recursive normalize III."

Figure 6E:
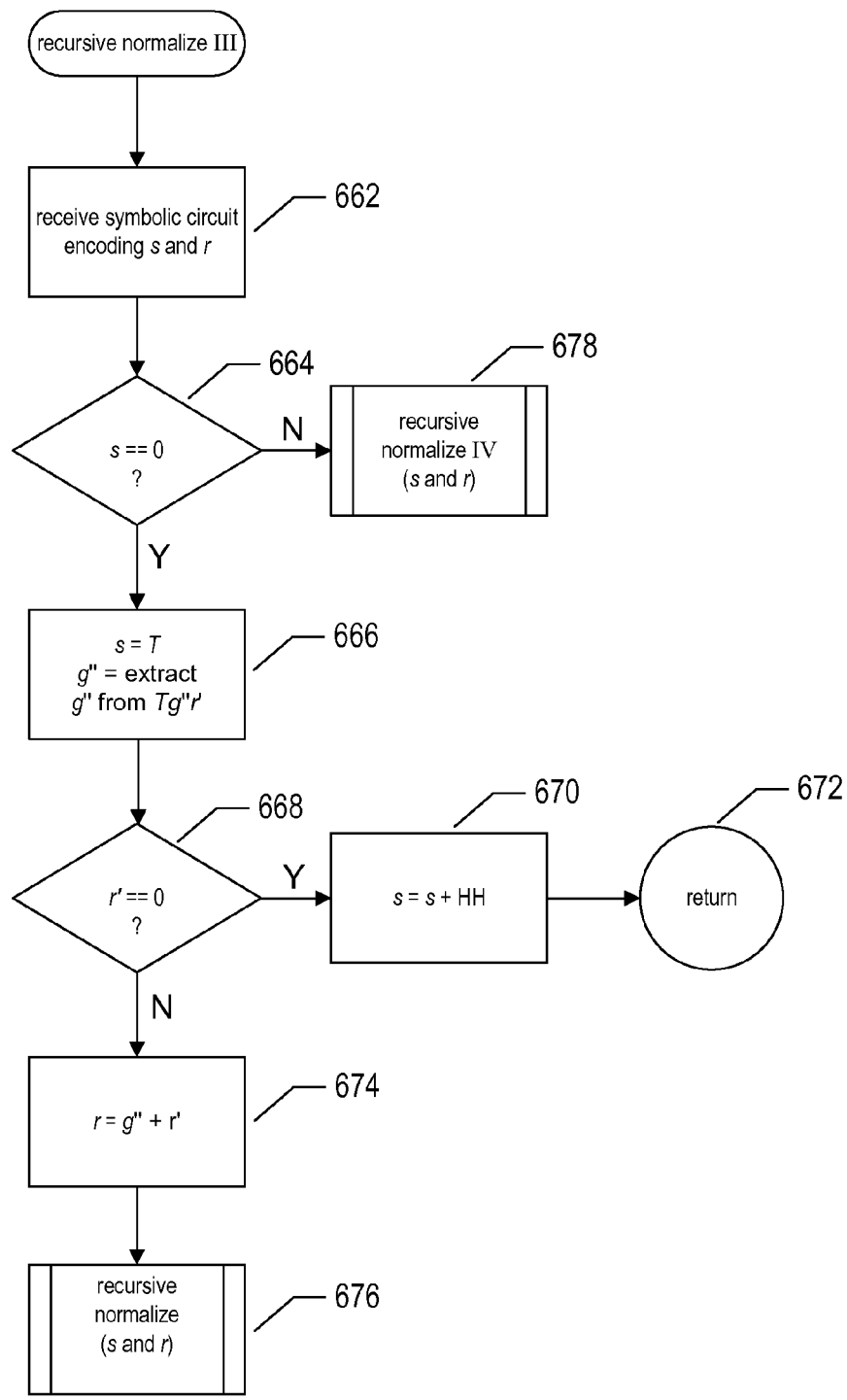

FIG. 6E provides a control-flow diagram for the routine "recursive normalize III," called in step 654 of FIG. 6D. When this routine is called, s may either be null or have the form s'T and r has the form gTr' or Tg"r', depending on whether or not the commutation rule is applied in step 650 of FIG. 6D. After the formal reception of symbolic circuit representations s and r, in step 662, the routine "recursive normalize III" determines whether or not s is null, in step 664. When s is null, then, in step 666, s is set to T and g" is extracted from r in the form Tg"r'. When r' is null, as determined in step 668, then s is set to s∘HH, in step 670, and the recursive normalization routine returns in step 672. When r' is not null, then r is set to g'∘r', in step 674, and a recursive call to the recursive normalization routine is made in step 676. In step 664, when s is determined not to be null, then the routine "recursive normalize IV" is called in step 678.

Figure 6F:
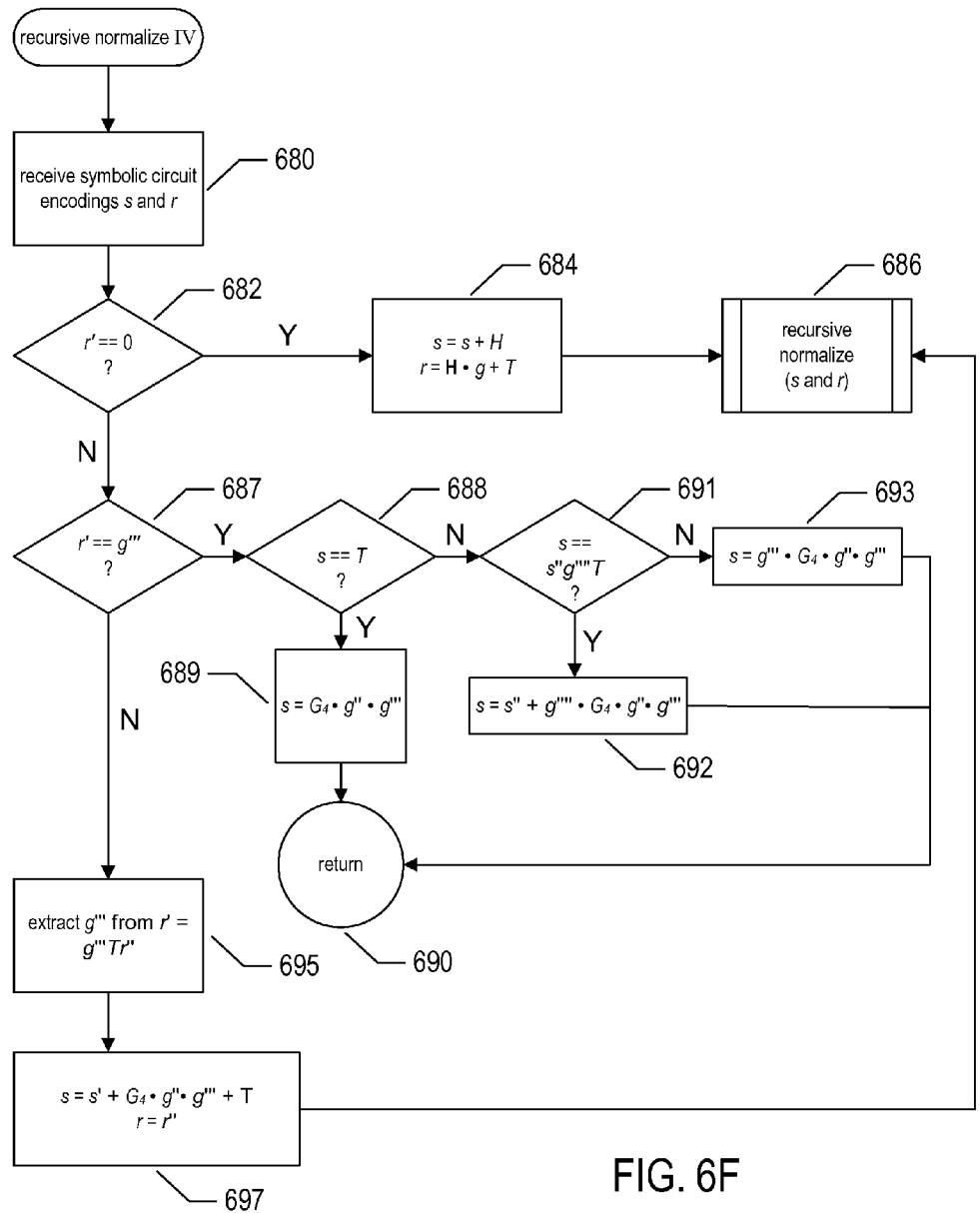

FIG. 6F provides a control-flow diagram for the routine "recursive normalize IV" called in step 678 of FIG. 6E. When the routine "recursive normalize IV" is called, r is in the form gTr' or Tg"r'. After the formal reception of the symbolic representations s and r, in step 680, the routine "recursive normalize IV" determines, in step 682, whether r' is null. When r is null, then, in step 684, s is set to s∘H, r is set to H●g∘T, and a recursive call to the recursive normalization routine is made in step 686. Otherwise, when r is the symbolic representation of a single Clifford gate g''', as determined in step 687, then when s is T, as determined in step 688, s is set to $G_4$●g"●g''' in step 689 and the recursive normalization routine returns in step 690. As discussed above, S is equivalent to TT, and S is the symbolic representation of $G_4$. Thus, the T at the end of s and the T at the beginning r' are transformed to S, which is then combined by group multiplication with the Clifford group members represented by g" and g'''. When s is not T, then, in step 691, the routine "recursive normalize IV" determines whether or not s has the form s"g""T. When s has this form, then s is set to s"∘g""●$G_4$●g"●g''' in step 692 followed by return of the recursive normalization routine in step 690. Otherwise, in step 693, s is set to g""●$G_4$●g"●g''' and the recursive normalization routine returns in step 690. In step 687, when r is determined not to be the symbolic representation of a single Clifford gate, then r' has a form g'''Tr" and g''' is extracted from r' in step 695. Then, in step 697, s is set to s'∘$G_4$●g"●g'''∘T and r is set to r' and the recursive normalization function is called recursively in step 686.

Although the present invention has been described in terms of particular embodiments, it is not intended that the invention be limited to these embodiments. Modifications within the spirit of the invention will be apparent to those skilled in the art. For example, symbolic circuit representations may use character symbols H, T, S, as used above, or may use other types of digital representations of H, T, and S gates, including numeric representations and compressed numeric representations, within an electronic memory of a computer system. The normalization of symbolic quantum-circuit representations in the <H,T> basis can be carried out using a variety of different implementations of the logic illustrated in FIGS. 6A-C, including non-recursive, iterative implementations, by varying any of many different design and implementation parameters, including programming language, operating system, hardware platform, data structures, control structures, modular organization, and other such parameters. As is further discussed above, symbolically representation quantum circuits in the normalized form, normal representations, and canonical forms provides a foundation for search-based quantum-circuit-design methods and systems.

REPRESENTATIVE EXAMPLES

The following labeled paragraphs describe representative examples.

A. A method for normalizing a representation of a quantum circuit u comprising a sequence of representations of H and T gates, the method comprising:

initially transforming the quantum circuit u to an equivalent quantum circuit x comprising either a representation of a single Clifford gate or one or more representations of a single-Clifford-gate, T-gate pair followed by a representation of a single Clifford gate;

transforming the quantum circuit x to an equivalent normal representation n comprising a sequence of representations of one or more gates selected from among TH, SH, and Clifford gates; and storing the normal representation n in a physical data-storage device including one of an electronic memory and a mass-storage device.

B. The method of paragraph A wherein initially transforming the quantum circuit u to an equivalent quantum circuit x comprising either a representation of a single Clifford gate or one or more representations of a single-Clifford-gate, T-gate pair followed by a representation of a single Clifford gate further comprises:

removing pairs of consecutive representations of H gates from u to generate an equivalent quantum circuit v comprising a sequence of representations of single H gates interleaved with runs of one or more T gates;

removing runs of 8 consecutive representations of T gates from v to generate an equivalent quantum circuit w comprising a sequence of representations of single H gates interleaved with runs of between one and 7 T gates; and substituting, for each remaining pair of consecutive T gates in w, an S gate to generate the equivalent quantum circuit x.

C. The method of paragraph A wherein transforming the quantum circuit x to an equivalent normal representation n comprising a sequence of representations of one or more gates selected from among TH, SH, and Clifford gates further comprises:

removing from x any internal Clifford-gate representations g other than representations of the Clifford groups corresponding to the gate H and the gate triplet HSH by commuting the Clifford-group member corresponding to the Clifford-gate representation g with the gate T to produce one of three types of equivalent Clifford-gate representations; and depending on the type of the equivalent Clifford-gate representation generated from g, further processing the equivalent Clifford-gate representation generated from g.

D. The method of paragraph C wherein processing a first type of equivalent Clifford-gate representation generated from g, comprising a first representation of the gate T followed by a representation of a Clifford group g', further comprises:

replacing a pair of T gates including the T gate represented by the first representation of the gate T with a representation of an S gate.

E. The method of paragraph C wherein further processing a second type of equivalent Clifford-gate representation generated from g, comprising a first representation of the pair of gates HT followed by a representation of a Clifford group g' further comprises:

replacing the Clifford-gate representation g with the first representation of the pair of gates HT followed by the representation of the Clifford group g'.

F. The method of paragraph C wherein further processing a third type of equivalent Clifford-gate representation generated from g, comprising a first representation of the four gates HSHT followed by a representation of a Clifford group g' further comprises:

replacing the Clifford-gate representation g with the first representation of the four gates HSHT followed by the representation of the Clifford group g'.

G. The method of paragraph A wherein the normal representation n has one of the two forms:

a representation of the gate H, a sequence of one or more representations of gates selected from among TH and SH gates, with each SH gate followed by a TH gate, and a representation of a Clifford gate; and a sequence of one or more representations of gates selected from among TH and SH gates, with each SH gate followed by a TH gate, and a representation of a Clifford gate.

H. A method for constructing a representation of possible quantum circuits represented as a sequence of representations of T and H gates, the method comprising:

generating a set of quantum circuits each represented as a sequence of representations of TH and SH gates, each quantum circuit in the initial set of quantum circuits including no SH gate before the fifth gate comprising a pair of gates constructed from two gates selected from among the S gate, the T gate, and the H gate, and each quantum circuit in the initial set of quantum circuits ending in the gate TH; and storing each quantum-circuit representation in the set of quantum circuits in one of one or more physical data-storage devices including one or more electronic memories and one or more mass-storage devices.

I. The method of paragraph H wherein composing a secondary set of representations of quantum circuits for each of the quantum circuits in the initial set from the quantum circuit and two Clifford gates further comprises:

to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a Clifford-gate pair.

J. The method of paragraph I wherein each of the number of copies of the quantum circuit are appended and prepended with Clifford gates selected from a different Clifford-gate pair.

K. A system for quantum-circuit design comprising:
one or more processors;
one or more electronic memories;
one or more mass-storage devices;
a first control program executed on one or more of the one or more processors to generate normal representations of quantum circuits, each normal representation comprising a sequence of representations of one or more gates selected from among TH, SH, and Clifford gates; and
a second control program executed on one or more of the one or more processors to construct a representation of possible quantum circuits represented as a sequence of representations of T and H gates.

L. The system of paragraph K wherein the first control program generates normal representations of quantum circuits by:

receiving a quantum circuit u comprising a sequence of representations of H and T gates;

initially transforming the quantum circuit u to an equivalent quantum circuit x comprising either a representation of a single Clifford gate or one or more representations of a single-Clifford-gate, T-gate pair followed by a representation of a single Clifford gate;

transforming the quantum circuit x to an equivalent normal representation n comprising a sequence of representations of one or more gates selected from among TH, SH, and Clifford gates; and storing the normal representation n in a physical data-storage device including one of an electronic memory and a mass-storage device.

M. The system of paragraph L wherein initially transforming the quantum circuit u to an equivalent quantum circuit x comprising either a representation of a single Clifford gate or one or more representations of a single-Clifford-gate, T-gate pair followed by a representation of a single Clifford gate further comprises:

removing pairs of consecutive representations of H gates from u to generate an equivalent quantum circuit v comprising a sequence of representations of single H gates interleaved with runs of one or more T gates;

removing runs of 8 consecutive representations of T gates from v to generate an equivalent quantum circuit w comprising a sequence of representations of single H gates interleaved with runs of between one and 7 T gates; and substituting, for each remaining pair of consecutive T gates in w, an S gate to generate the equivalent quantum circuit x.

N. The system of paragraph L wherein transforming the quantum circuit x to an equivalent normal representation n comprising a sequence of representations of one or more gates selected from among TH, SH, and Clifford gates further comprises:

removing from x any internal Clifford-gate representations g other than representations of the Clifford groups corresponding to the gate H and the gate triplet HSH by commuting the Clifford-group member corresponding to the Clifford-gate representation g with the gate T to produce one of three types of equivalent Clifford-gate representations; and depending on the type of the equivalent Clifford-gate representation generated from g, further processing the equivalent Clifford-gate representation generated from g.

O. The system of paragraph N wherein processing a first type of equivalent Clifford-gate representation generated from g, comprising a first representation of the gate T followed by a representation of a Clifford group g', further comprises:

replacing a pair of T gates including the T gate represented by the first representation of the gate T with a representation of an S gate.

P. The system of paragraph N wherein further processing a second type of equivalent Clifford-gate representation generated from g, comprising a first representation of the pair of gates HT followed by a representation of a Clifford group g' further comprises:

replacing the Clifford-gate representation g with the first representation of the pair of gates HT followed by the representation of the Clifford group g'.

Q. The system of paragraph N wherein further processing a third type of equivalent Clifford-gate representation generated from g, comprising a first representation of the four gates HSHT followed by a representation of a Clifford group g' further comprises:

replacing the Clifford-gate representation g with the first representation of the four gates HSHT followed by the representation of the Clifford group g'.

R. The system of claim wherein the normal representation n has one of the two forms:

a representation of the gate H, a sequence of one or more representations of gates selected from among TH and SH gates, with each SH gate followed by a TH gate, and a representation of a Clifford gate; and a sequence of one or more representations of gates selected from among TH and SH gates, with each SH gate followed by a TH gate, and a representation of a Clifford gate.

S. The system of paragraph K wherein the second control program constructs a representation of possible quantum circuits represented as a sequence of representations of T and H gates by:

generating a set of quantum circuits each represented as a sequence of representations of TH and SH gates, each quantum circuit in the initial set of quantum circuits including no SH gate before the fifth gate comprising a pair of gates constructed from two gates selected from among the S gate, the T gate, and the H gate, and each quantum circuit in the initial set of quantum circuits ending in the gate TH; and storing each quantum-circuit representation in the set of quantum circuits in one of one or more physical data-storage devices including one or more electronic memories and one or more mass-storage devices.

T. The system of paragraph S wherein composing a secondary set of representations of quantum circuits for each of the quantum circuits in the initial set from the quantum circuit and two Clifford gates further comprises:

to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a Clifford-gate pair, wherein each of the number of copies of the quantum circuit are appended and prepended with Clifford gates selected from a different Clifford-gate pair.

AA. A method for defining a quantum circuit u comprising a sequence of representations of quantum gates H and quantum gates T, wherein the quantum gates H and T are represented $$\text{by } \begin{bmatrix} \frac{i}{\sqrt{2}} & \frac{i}{\sqrt{2}} \\ \frac{i}{\sqrt{2}} & \frac{-i}{\sqrt{2}} \end{bmatrix} \text{ and } \begin{bmatrix} e^{-i\frac{\pi}{8}} & 0 \\ 0 & e^{i\frac{\pi}{8}} \end{bmatrix},$$

respectively, the method comprising:

initially transforming, by a digital computing device, the quantum circuit u to a quantum circuit x comprising either a representation of a single Clifford gate or one or more representations of a single Clifford gate, a first quantum gate T and a second quantum gate T that form a T gate pair followed by a representation of a single Clifford gate, wherein the quantum circuit x and the quantum circuit u are equivalent;

transforming, by the digital computing device, the quantum circuit x to a normal representation n comprising a sequence of representations of one or more quantum gates selected from among quantum gates TH, quantum gates SH, and Clifford gates, wherein the quantum circuit x and the normal representation n are equivalent, and wherein a quantum gate S is represented by $$\begin{bmatrix} e^{-i\frac{\pi}{4}} & 0 \\ 0 & e^{i\frac{\pi}{4}} \end{bmatrix}; \text{ and}$$

defining a quantum circuit based on the normal representation.

BB. The method of paragraph AA, wherein initially transforming, by the digital computing device, the quantum circuit u to the quantum circuit x comprising either the representation of the single Clifford gate or one or more representations of the single Clifford gate, the T gate pair followed by the representation of the single Clifford gate further comprises:

removing pairs of consecutive representations of quantum gates H from the quantum circuit u to generate a quantum circuit v comprising a sequence of representations of single quantum gates H interleaved with runs of one or more quantum gates T, wherein the quantum circuit u and the quantum circuit v are equivalent;

removing runs of eight consecutive representations of quantum gates T from the quantum circuit v to generate a quantum circuit w comprising a sequence of representations of single quantum gates H interleaved with runs of between one and seven quantum gates T, wherein the quantum circuit v and the quantum circuit w are equivalent; and substituting, for each remaining pair of consecutive quantum gates T in the quantum circuit w, a quantum gate S to generate the quantum circuit x.

CC. The method of paragraph AA, wherein transforming, by the digital computing device, the quantum circuit x to the normal representation n comprising the sequence of representations of one or more quantum gates selected from among quantum gates TH, quantum gates SH, and Clifford gates further comprises:

removing from the quantum circuit x any internal Clifford-gate symbolic representations g other than representations of a Clifford group corresponding to a quantum gate H and a triplet of quantum gates corresponding to the quantum gates HSH by commuting a Clifford-group member corresponding to the Clifford-gate symbolic representation g with the quantum gate T to produce one of three types of equivalent Clifford-gate symbolic representations; and depending on the type of the equivalent Clifford-gate symbolic representation generated from g, further processing the equivalent Clifford-gate symbolic representation generated from g.

DD. The method of paragraph CC, wherein processing a first type of equivalent Clifford-gate symbolic representation generated from g, comprising a first representation of a quantum gate T followed by a representation of a Clifford-group element g', further comprises:

replacing a pair of quantum gates T including the quantum gate T represented by the first representation of the quantum gate T with a representation of a quantum gate S.

EE. The method of paragraph CC, wherein further processing a second type of equivalent Clifford-gate symbolic representation generated from g, comprising a first representation of the pair of quantum gates HT followed by a representation of a Clifford-group element g' further comprises:

replacing the Clifford-gate symbolic representation g with the first representation of the pair of quantum gates HT followed by the representation of the Clifford-group element g'.

FF. The method of paragraph CC, wherein further processing a third type of equivalent Clifford-gate symbolic representation generated from g, comprising a first representation of the four quantum gates HSHT followed by a representation of a Clifford-group element g' further comprises:

replacing the Clifford-gate symbolic representation g with the first representation of the four quantum gates HSHT followed by the representation of the Clifford-group element g'.

GG. The method of paragraph AA, wherein the normal representation n has one of the two forms:

a representation of the quantum gate H, a sequence of one or more representations of gates selected from among quantum gates TH and quantum gates SH, with each quantum gate SH followed by a quantum gate TH, and a representation of a Clifford gate; and a sequence of one or more representations of gates selected from among quantum gates TH and quantum gate SH, with each quantum gate SH followed by a quantum gate TH, and a representation of a Clifford gate.

HH. A method for constructing a representation of possible quantum circuits represented as a sequence of representations of quantum gate T and H, wherein the quantum gates H and T are represented by $$\begin{bmatrix} \frac{i}{\sqrt{2}} & \frac{i}{\sqrt{2}} \\ \frac{i}{\sqrt{2}} & \frac{-i}{\sqrt{2}} \end{bmatrix} \text{ and } \begin{bmatrix} e^{-i\frac{\pi}{8}} & 0 \\ 0 & e^{i\frac{\pi}{8}} \end{bmatrix},$$

respectively, the method comprising:

generating a set of quantum circuits each represented as a sequence of representations of quantum gates TH and quantum gates SH, each quantum circuit in an initial set of quantum circuits including no quantum gate SH before a fifth quantum gate comprising a pair of quantum gates constructed from two quantum gates selected from among the quantum gate S, the quantum gate T, and the quantum gate H, and each quantum circuit in the initial set of quantum circuits ending in the quantum gate TH, wherein the quantum gate S is represented by $$\begin{bmatrix} e^{-i\frac{\pi}{4}} & 0 \\ 0 & e^{i\frac{\pi}{4}} \end{bmatrix};$$

and storing each quantum-circuit representation in the set of quantum circuits in one of one or more physical data-storage devices including one or more electronic memories and one or more mass-storage devices.

II. The method of paragraph HH, wherein composing a secondary set of representations of quantum circuits for each of the quantum circuits in the initial set from the quantum circuit and two Clifford gates further comprises:

to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a pair of Clifford gates.

JJ. The method of paragraph II, wherein each of the number of copies of the quantum circuit are appended and prepended with Clifford gates selected from a different pair of Clifford gates.

KK. A system for quantum-circuit design comprising:

one or more processors;

one or more electronic memories;

one or more mass-storage devices, the one or more mass-storage devices or electronic memories storing a first control program executable on one or more of the processors to generate normal representations of quantum circuits, each normal representation comprising a sequence of representations of one or more quantum gates selected from among quantum TH, SH, and Clifford gates, wherein a quantum gate H, a quantum gate T and a quantum gate S are represented by $$\begin{bmatrix} \frac{i}{\sqrt{2}} & \frac{i}{\sqrt{2}} \\ \frac{i}{\sqrt{2}} & \frac{-i}{\sqrt{2}} \end{bmatrix}, \begin{bmatrix} e^{-i\frac{\pi}{8}} & 0 \\ 0 & e^{i\frac{\pi}{8}} \end{bmatrix} \text{ and } \begin{bmatrix} e^{-i\frac{\pi}{4}} & 0 \\ 0 & e^{i\frac{\pi}{4}} \end{bmatrix},$$

respectively; and a second control program stored in the one or more mass-storage devices or electronic memories and executable on one or more of the one or more processors to construct a representation of possible quantum circuits represented as a sequence of representations of quantum gates T and quantum gates H.

LL. The system of paragraph KK, wherein the first control program generates normal representations of quantum circuits by:

receiving a quantum circuit u comprising a sequence of representations of quantum gates H and quantum gates T;

initially transforming the quantum circuit u to an equivalent quantum circuit x comprising either a representation of a single Clifford gate or one or more representations of a single Clifford gate, a pair of quantum T gates followed by a representation of a single Clifford gate;

transforming the quantum circuit x to an equivalent normal representation n comprising a sequence of representations of one or more quantum gates selected from among quantum gates TH, SH, and Clifford gates; and storing the equivalent normal representation n in a physical data-storage device including one of an electronic memory and a mass-storage device.

MM. The system of paragraph LL, wherein initially transforming the quantum circuit u to an equivalent quantum circuit x comprising either a representation of a single Clifford gate or one or more representations of a single Clifford gate, a pair of quantum gates T followed by a representation of a single Clifford gate further comprises:

removing pairs of consecutive representations of quantum gates H from u to generate an equivalent quantum circuit v comprising a sequence of representations of single quantum gates H interleaved with runs of one or more quantum gates T;

removing runs of 8 consecutive representations of quantum gates T from v to generate an equivalent quantum circuit w comprising a sequence of representations of single quantum gates H interleaved with runs of between one and 7 quantum gates T; and substituting, for each remaining pair of consecutive quantum gates T in w, a quantum gate S to generate the equivalent quantum circuit x.

NN. The system of paragraph LL, wherein transforming the quantum circuit x to an equivalent normal representation n comprising a sequence of representations of one or more gates selected from among quantum gates TH, quantum gates SH, and Clifford gates further comprises:

removing from x any internal Clifford-gate symbolic representations g other than representations of the Clifford groups corresponding to the quantum gate H and the quantum gate triplet HSH by commuting the Clifford-group member corresponding to the Clifford-gate symbolic representation g with the quantum gate T to produce one of three types of equivalent Clifford-gate representations; and depending on the type of the equivalent Clifford-gate symbolic representation generated from g, further processing the equivalent Clifford-gate symbolic representation generated from g.

00. The system of paragraph NN, wherein processing a first type of equivalent Clifford-gate symbolic representation generated from g, comprising a first representation of the quantum gate T followed by a representation of a Clifford-group element g', further comprises:

replacing a pair of quantum gates T including the quantum T gate represented by the first representation of the quantum gate T with a representation of a quantum S gate.

PP. The system of paragraph NN, wherein further processing a second type of equivalent Clifford-gate symbolic representation generated from g, comprising a first representation of the pair of quantum gates HT followed by a representation of a Clifford-group element g' further comprises:

replacing the Clifford-gate symbolic representation g with the first representation of the pair of quantum gates HT followed by the representation of the Clifford-group element g'.

QQ. The system of paragraph NN, wherein further processing a third type of equivalent Clifford-gate symbolic representation generated from g, comprising a first representation of the four quantum gates HSHT followed by a representation of a Clifford-group element g' further comprises:

replacing the Clifford-gate symbolic representation g with the first representation of four quantum gates HSHT followed by the representation of the Clifford-group element g'.

RR. The system of paragraph KK, wherein the normal representation n has one of the two forms:

a representation of the quantum gate H, a sequence of one or more representations of quantum gates selected from among quantum gates TH and SH, with each quantum gate SH followed by a quantum gate TH, and a representation of a Clifford gate; and a sequence of one or more representations of quantum gates selected from among quantum gates TH and SH, with each quantum gate SH followed by a quantum gate TH, and a representation of a Clifford gate.

SS. The system of paragraph KK, wherein the second control program constructs a representation of possible quantum circuits represented as a sequence of representations of quantum gates T and H by:

generating a set of quantum circuits each represented as a sequence of representations of quantum gates TH and quantum gates SH, each quantum circuit in an initial set of quantum circuits including no quantum gate SH before the fifth gate comprising a pair of quantum gates constructed from two quantum gates selected from among the quantum gate S, the quantum gate T, and the quantum gate H, and each quantum circuit in the initial set of quantum circuits ending in the quantum gate TH; and storing each quantum-circuit representation in the set of quantum circuits in one of one or more physical data-storage devices including one or more electronic memories and one or more mass-storage devices.

TT. The system of paragraph SS, wherein composing a secondary set of representations of quantum circuits for each of the quantum circuits in the initial set from the quantum circuit and two Clifford gates further comprises:
to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a Clifford-gate pair, wherein each of the number of copies of the quantum circuit are appended and prepended with Clifford gates selected from a different Clifford-gate pair.

It is appreciated that the previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

The invention claimed is:

1. A method for defining a quantum circuit u comprising a sequence of representations of quantum gates H and quantum gates T, wherein the quantum gates H and T are represented by $$\begin{bmatrix} \frac{i}{\sqrt{2}} & \frac{i}{\sqrt{2}} \\ \frac{i}{\sqrt{2}} & \frac{-i}{\sqrt{2}} \end{bmatrix} \text{ and } \begin{bmatrix} e^{-i\frac{\pi}{8}} & 0 \\ 0 & e^{i\frac{\pi}{8}} \end{bmatrix},$$

respectively, the method comprising:
initially transforming, by a digital computing device, the quantum circuit u to a quantum circuit x comprising either a representation of a single Clifford gate or one or more representations of a single Clifford gate, a first quantum gate T and a second quantum gate T that form a T gate pair followed by a representation of a single Clifford gate, wherein the quantum circuit x and the quantum circuit u are equivalent;
transforming, by the digital computing device, the quantum circuit x to a normal representation n comprising a sequence of representations of one or more quantum gates selected from among quantum gates TH, quantum gates SH, and Clifford gates, wherein the quantum circuit x and the normal representation n are equivalent, and wherein a quantum gate S is represented by $$\begin{bmatrix} e^{-i\frac{\pi}{4}} & 0 \\ 0 & e^{i\frac{\pi}{4}} \end{bmatrix}; \text{ and}$$

implementing a quantum circuit based on the normal representation.

2. The method of claim 1, wherein initially transforming, by the digital computing device, the quantum circuit u to the quantum circuit x comprising either the representation of the single Clifford gate or one or more representations of the single Clifford gate, the T gate pair followed by the representation of the single Clifford gate further comprises:
removing pairs of consecutive representations of quantum gates H from the quantum circuit u to generate a quantum circuit v comprising a sequence of representations of single quantum gates H interleaved with runs of one or more quantum gates T, wherein the quantum circuit u and the quantum circuit v are equivalent;
removing runs of eight consecutive representations of quantum gates T from the quantum circuit v to generate a quantum circuit w comprising a sequence of representations of single quantum gates H interleaved with runs of between one and seven quantum gates T, wherein the quantum circuit v and the quantum circuit w are equivalent; and
substituting, for each remaining pair of consecutive quantum gates T in the quantum circuit w, a quantum gate S to generate the quantum circuit x.

3. The method of claim 1, wherein transforming, by the digital computing device, the quantum circuit x to the normal representation n comprising the sequence of representations of one or more quantum gates selected from among quantum gates TH, quantum gates SH, and Clifford gates further comprises:
removing from the quantum circuit x any internal Clifford-gate symbolic representations g other than representations of a Clifford group corresponding to a quantum gate H and a triplet of quantum gates corresponding to the quantum gates HSH by commuting a Clifford-group member corresponding to the Clifford-gate symbolic representation g with a quantum gate T to produce one of three types of equivalent Clifford-gate symbolic representations; and
depending on the type of the equivalent Clifford-gate symbolic representation generated from g, further processing the equivalent Clifford-gate symbolic representation generated from g.

4. The method of claim 3, wherein processing a first type of equivalent Clifford-gate symbolic representation generated from g, comprising a first representation of a quantum gate T followed by a representation of a Clifford-group element g', further comprises:
replacing a pair of quantum gates T including the quantum gate T represented by the first representation of the quantum gate T with a representation of a quantum gate S.

5. The method of claim 3, wherein further processing a second type of equivalent Clifford-gate symbolic representation generated from g, comprising a first representation of the pair of quantum gates HT followed by a representation of a Clifford-group element g' further comprises:
replacing the Clifford-gate symbolic representation g with the first representation of the pair of quantum gates HT followed by the representation of the Clifford-group element g'.

6. The method of claim 3, wherein further processing a third type of equivalent Clifford-gate symbolic representation generated from g, comprising a first representation of the four quantum gates HSHT followed by a representation of a Clifford-group element g' further comprises:
replacing the Clifford-gate symbolic representation g with the first representation of the four quantum gates HSHT followed by the representation of the Clifford-group element g'.

7. The method of claim 1, wherein the normal representation n has one of the two forms:

a representation of the quantum gate H, a sequence of one or more representations of gates selected from among quantum gates TH and quantum gates SH, with each quantum gate SH followed by a quantum gate TH, and a representation of a Clifford gate; and a sequence of one or more representations of gates selected from among quantum gates TH and quantum gate SH, with each quantum gate SH followed by a quantum gate TH, and a representation of a Clifford gate.

8. A method for constructing a representation of possible quantum circuits represented as a sequence of representations of quantum gate T and H, wherein the quantum gates H and T are represented by $$\begin{bmatrix} \frac{i}{\sqrt{2}} & \frac{i}{\sqrt{2}} \\ \frac{i}{\sqrt{2}} & -\frac{i}{\sqrt{2}} \end{bmatrix} \text{ and } \begin{bmatrix} e^{-i\frac{\pi}{8}} & 0 \\ 0 & e^{i\frac{\pi}{8}} \end{bmatrix},$$

respectively, the method comprising:
generating a set of quantum circuits each represented as a sequence of representations of quantum gates TH and quantum gates SH, each quantum circuit in an initial set of quantum circuits including no quantum gate SH before a fifth quantum gate comprising a pair of quantum gates constructed from two quantum gates selected from among the quantum gate S, the quantum gate T, and the quantum gate H, and each quantum circuit in the initial set of quantum circuits ending in the quantum gate TH, wherein the quantum gate S is represented by $$\begin{bmatrix} e^{-i\frac{\pi}{4}} & 0 \\ 0 & e^{i\frac{\pi}{4}} \end{bmatrix};$$

storing each quantum-circuit representation in the set of quantum circuits in one of one or more physical data-storage devices including one or more electronic memories and one or more mass-storage devices; and
implementing a quantum circuit based on the stored quantum circuit representations.

9. The method of claim 8, wherein composing a secondary set of representations of quantum circuits for each of the quantum circuits in the initial set from the quantum circuit and two Clifford gates further comprises:
to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a pair of Clifford gates.

10. The method of claim 9, wherein each of the number of copies of the quantum circuit are appended and prepended with Clifford gates selected from a different pair of Clifford gates.

11. A system for quantum-circuit design comprising:
one or more processors;
one or more electronic memories;
one or more mass-storage devices, the one or more mass-storage devices or electronic memories storing a first control program executable on one or more of the processors to generate normal representations of quantum circuits, each normal representation comprising a sequence of representations of one or more quantum gates selected from among quantum TH, SH, and Clifford gates, wherein a quantum gate H, a quantum gate T and a quantum gate S are represented by $$\begin{bmatrix} \frac{i}{\sqrt{2}} & \frac{i}{\sqrt{2}} \\ \frac{i}{\sqrt{2}} & -\frac{i}{\sqrt{2}} \end{bmatrix}, \begin{bmatrix} e^{-i\frac{\pi}{8}} & 0 \\ 0 & e^{i\frac{\pi}{8}} \end{bmatrix} \text{ and } \begin{bmatrix} e^{-i\frac{\pi}{4}} & 0 \\ 0 & e^{i\frac{\pi}{4}} \end{bmatrix},$$

respectively; and
a second control program stored in the one or more mass-storage devices or electronic memories and executable on one or more of the one or more processors to construct a representation of possible quantum circuits represented as a sequence of representations of quantum gates T and quantum gates H and implement at least one quantum circuit based on the representation.

12. The system of claim 11, wherein the first control program generates normal representations of quantum circuits by:
receiving a quantum circuit u comprising a sequence of representations of quantum gates H and quantum gates T;
initially transforming the quantum circuit u to an equivalent quantum circuit x comprising either a representation of a single Clifford gate or one or more representations of a single Clifford gate, a pair of quantum T gates followed by a representation of a single Clifford gate;
transforming the quantum circuit x to an equivalent normal representation n comprising a sequence of representations of one or more quantum gates selected from among quantum gates TH, SH, and Clifford gates; and
storing the equivalent normal representation n in a physical data-storage device including one of an electronic memory and a mass-storage device.

13. The system of claim 12, wherein initially transforming the quantum circuit u to an equivalent quantum circuit x comprising either a representation of a single Clifford gate or one or more representations of a single Clifford gate, a pair of quantum gates T followed by a representation of a single Clifford gate further comprises:
removing pairs of consecutive representations of quantum gates H from u to generate an equivalent quantum circuit v comprising a sequence of representations of single quantum gates H interleaved with runs of one or more quantum gates T;
removing runs of 8 consecutive representations of quantum gates T from v to generate an equivalent quantum circuit w comprising a sequence of representations of single quantum gates H interleaved with runs of between one and 7 quantum gates T; and
substituting, for each remaining pair of consecutive quantum gates T in w, a quantum gate S to generate the equivalent quantum circuit x.

14. The system of claim 12, wherein transforming the quantum circuit x to an equivalent normal representation n comprising a sequence of representations of one or more gates selected from among quantum gates TH, quantum gates SH, and Clifford gates further comprises:

removing from x any internal Clifford-gate symbolic representations g other than representations of the Clifford groups corresponding to the quantum gate H and a quantum gate triplet HSH by commuting the Clifford-group member corresponding to the Clifford-gate symbolic representation g with the quantum gate T to produce one of three types of equivalent Clifford-gate representations; and depending on the type of the equivalent Clifford-gate symbolic representation generated from g, further processing the equivalent Clifford-gate symbolic representation generated from g.

15. The system of claim 14, wherein processing a first type of equivalent Clifford-gate symbolic representation generated from g, comprising a first representation of the quantum gate T followed by a representation of a Clifford-group element g', further comprises:

replacing a pair of quantum gates T including the quantum T gate represented by the first representation of the quantum gate T with a representation of a quantum S gate.

16. The system of claim 14, wherein further processing a second type of equivalent Clifford-gate symbolic representation generated from g, comprising a first representation of the pair of quantum gates HT followed by a representation of a Clifford-group element g' further comprises:

replacing the Clifford-gate symbolic representation g with the first representation of the pair of quantum gates HT followed by the representation of the Clifford-group element g'.

17. The system of claim 14, wherein further processing a third type of equivalent Clifford-gate symbolic representation generated from g, comprising a first representation of four quantum gates HSHT followed by a representation of a Clifford-group element g' further comprises:

replacing the Clifford-gate symbolic representation g with the first representation of four quantum gates HSHT followed by the representation of the Clifford-group element g'.

18. The system of claim 11, wherein the normal representation n has one of the two forms:

a representation of the quantum gate H, a sequence of one or more representations of quantum gates selected from among quantum gates TH and SH, with each quantum gate SH followed by a quantum gate TH, and a representation of a Clifford gate; and a sequence of one or more representations of quantum gates selected from among quantum gates TH and SH, with each quantum gate SH followed by a quantum gate TH, and a representation of a Clifford gate.

19. The system of claim 11, wherein the second control program constructs a representation of possible quantum circuits represented as a sequence of representations of quantum gates T and H by:

generating a set of quantum circuits each represented as a sequence of representations of quantum gates TH and quantum gates SH, each quantum circuit in an initial set of quantum circuits including no quantum gate SH before the fifth gate comprising a pair of quantum gates constructed from two quantum gates selected from among the quantum gate S, the quantum gate T, and the quantum gate H, and each quantum circuit in the initial set of quantum circuits ending in the quantum gate TH; and storing each quantum-circuit representation in the set of quantum circuits in one of one or more physical data-storage devices including one or more electronic memories and one or more mass-storage devices.

20. The system of claim 19, wherein composing a secondary set of representations of quantum circuits for each of the quantum circuits in the initial set from the quantum circuit and two Clifford gates further comprises:

to each of the quantum circuits in the initial set, generating a secondary set of representations by prepending, to each of a number of copies of the quantum circuit, a representation of a first Clifford gate and appending a representation of a second Clifford gate, the first Clifford gate and the second Clifford gate selected from a Clifford-gate pair, wherein each of the number of copies of the quantum circuit are appended and prepended with Clifford gates selected from a different Clifford-gate pair, wherein the quantum circuit u is a rotation.

* * * * *